US008652571B2

(12) United States Patent
Nakazawa

(10) Patent No.: US 8,652,571 B2
(45) Date of Patent: Feb. 18, 2014

(54) SPIN COATING METHOD AND SPIN COATING APPARATUS

(75) Inventor: Keisuke Nakazawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 651 days.

(21) Appl. No.: 12/396,706

(22) Filed: Mar. 3, 2009

(65) Prior Publication Data

US 2009/0226615 A1 Sep. 10, 2009

(30) Foreign Application Priority Data

Mar. 4, 2008 (JP) ................................ 2008-053404

(51) Int. Cl.
*B05D 3/12* (2006.01)

(52) U.S. Cl.
USPC ............ 427/240; 427/425; 118/52; 118/320; 438/780; 438/782

(58) Field of Classification Search
USPC ............ 427/240, 425; 118/52, 320; 438/758, 438/780, 782
See application file for complete search history.

(56) References Cited

U.S. PATENT DOCUMENTS

| | | | |
|---|---|---|---|
| 5,405,813 A | 4/1995 | Rodrigues | |
| 5,773,083 A | 6/1998 | Fischer et al. | |
| 5,912,049 A * | 6/1999 | Shirley | 427/240 |
| 6,436,851 B1 | 8/2002 | Young et al. | |
| 6,613,700 B2 | 9/2003 | Hall et al. | |
| 6,849,293 B2 | 2/2005 | Rawat | |
| 2007/0092643 A1 * | 4/2007 | Yoshihara et al. | 427/240 |
| 2008/0069948 A1 * | 3/2008 | Yoshihara et al. | 427/240 |

FOREIGN PATENT DOCUMENTS

| | | |
|---|---|---|
| JP | 5-123632 | 5/1993 |
| JP | 5-243140 | 9/1993 |
| JP | 8-330206 | 12/1996 |
| JP | 2638969 | 4/1997 |
| JP | 11-16810 A * | 1/1999 |
| JP | 2000-157922 | 6/2000 |
| JP | 2000-279874 | 10/2000 |
| JP | 2003-303757 | 10/2003 |
| JP | 2004-64071 | 2/2004 |
| JP | 2004-273488 | 9/2004 |
| JP | 2006-156565 | 6/2006 |

OTHER PUBLICATIONS

JPO Computer translation of JP 2006-156565, published Jun. 2006.*
Notification of Reasons for Rejection issued by the Japanese Patent Office on Jun. 18, 2010, for Japanese Patent Application No. 2008-053404, and English-language translation thereof.

* cited by examiner

*Primary Examiner* — Kirsten Jolley
(74) *Attorney, Agent, or Firm* — Finnegan, Henderson, Farabow, Garrett & Dunner, L.L.P.

(57) ABSTRACT

A spin coating apparatus that supplies a coating liquid to a substrate and rotating the substrate to form a coating film, has a holding part that holds the substrate mounted thereon in a horizontal position; a rotationally driving source that rotationally drives the holding part about a rotational axis parallel with the vertical direction, thereby rotating the substrate; and a coating liquid supplying part that supplies the coating liquid to the substrate held by the holding part.

10 Claims, 26 Drawing Sheets

NUMBER OF REVOLUTIONS
$N_1$
$N_2$
$N_4$
$N_3$
$T_1$ $T_2$ $T_3$ $T_4$
(DISPENSING) (DISPENSING)
PROCESSING TIME

| STEP | DURATION [sec] | NUMBER OF REVOLUTIONS [rpm] | AMOUNT OF DISCHARGE OF COATING LIQUID [m] | DISCHARGE ACCELERATION [ml/sec$^2$] | DISCHARGE DECELERATION [ml/sec$^2$] |
|---|---|---|---|---|---|
| S1 | $T_1$ | $N_1$ | $M_1$ | 40 | 40 |
| S2 | $T_2$ | $N_2$ | $M_2$ | 40 | 40 |
| S3 | 1.0 | $N_3$ | – | – | – |
| S4 | 16.0 | $N_4$ | – | – | – |

FIG. 5

| $N_1 \setminus N_2$ | 1500[rpm] | VISUAL CHECK | 2000[rpm] | VISUAL CHECK | 3000[rpm] | VISUAL CHECK | 3500[rpm] | VISUAL CHECK |
|---|---|---|---|---|---|---|---|---|
| 3000[rpm] | 4.5995 | ○ | 6.6163 | ○ | 12.5266 | × | 11.5813 | × |
| 3500[rpm] | 5.0496 | ○ | 6.6116 | ○ | 13.3501 | × | 10.7711 | × |

※ VISUAL CHECK RESULT: CIRCLE MARK INDICATES ENTIRE WAFER IS COATED; AND CROSS MARK INDICATES THAT EDGE PART REMAINS UNCOATED

FIG. 8

| $V_1 \backslash V_2$ | 0.5[ml/s] | | 1.0[ml/s] | | 2.0[ml/s] | |
|---|---|---|---|---|---|---|
| | IN-PLANE UNIFORMITY | VISUAL CHECK | IN-PLANE UNIFORMITY | VISUAL CHECK | IN-PLANE UNIFORMITY | VISUAL CHECK |
| 0.5[ml/s] | 180.0565 | × | 7.932 | ○ | 4.8192 | ○ |
| 0.1[ml/s] | 179.9868 | × | 8.3335 | ○ | 4.2736 | ○ |
| 2.0[ml/s] | 179.7616 | × | 8.1454 | ○ | 4.4244 | ○ |

※ VISUAL CHECK RESULT: CIRCLE MARK INDICATES THAT ENTIRE WAFER IS COATED; AND CROSS MARK INDICATES THAT EDGE PART REMAINS UNCOATED

FIG. 9

| STEP S1 | | | STEP S2 | | | STEP S4 | MEASUREMENT RESULT | |
|---|---|---|---|---|---|---|---|---|
| $N_1$ [rpm] | $T_1$ [sec] | $M_1$ [ml] | $N_2$ [rpm] | $T_2$ [sec] | $M_2$ [ml] | $M_4$ [ml] | $3\sigma/\langle x\rangle$ [%] | VISUAL CHECK |
| 3000 | 0.5 | 0.5 | 1500 | 0.2 | 0.2 | 694 | 5.4589 | ○ |
| 3000 | 0.4 | 0.4 | 1500 | 0.3 | 0.3 | 694 | 3.934 | ○ |
| 3000 | 0.3 | 0.3 | 1500 | 0.4 | 0.4 | 694 | 3.9604 | × |
| 3000 | 0.2 | 0.2 | 1500 | 0.5 | 0.5 | 694 | 3.5476 | × |

※ VISUAL CHECK RESULT: CIRCLE MARK INDICATES THAT ENTIRE WAFER IS COATED; AND CROSS MARK INDICATES THAT EDGE PART REMAINS UNCOATED

FIG. 10

| STEP S1 | | | | STEP S2 | | | | STEP S4 | MEASUREMENT RESULT | |
|---|---|---|---|---|---|---|---|---|---|---|
| $N_1$ [rpm] | $T_1$ [sec] | $M_1$ [ml] | ACCELERATION/ DECELERATION [ml/sec$^2$] | $N_2$ [rpm] | $T_2$ [sec] | $M_2$ [ml] | ACCELERATION/ DECELERATION [ml/sec$^2$] | $M_4$ [ml] | $3\sigma/\langle x\rangle$ [%] | VISUAL CHECK |
| 3000 | 0.4 | 0.4 | 40/- | 1500 | 0.3 | 0.3 | 80/40 | 694 | 4.2739 | ○ |
| 3000 | 0.4 | 0.4 | 40/40 | 1500 | 0.3 | 0.3 | 40/40 | 694 | 4.1329 | ○ |

※ VISUAL CHECK RESULT: CIRCLE MARK INDICATES THAT ENTIRE WAFER IS COATED; AND CROSS MARK INDICATES THAT EDGE PART REMAINS UNCOATED

FIG. 12

| FACTOR SYMBOL | A | B | C | D | E | F | G | H |
|---|---|---|---|---|---|---|---|---|
| LEVEL | DISCHARGE ACCELERATION IN STEP S2 [ml/sec$^2$] | DISCHARGE ACCELERATION IN STEP S1 [ml/sec$^2$] | DISCHARGE DECELERATION IN STEP S1 [ml/sec$^2$] | $N_1$ [rpm] | $N_2$ [rpm] | AMOUNT OF COATING LIQUID DISPENSED IN STEP S1 | DISCHARGE RATE IN STEP S2 [ml/sec] | DISCHARGE RATE IN STEP S2 [ml/sec] |
| 1 | 40 | 40 | – | 2500 | 1000 | 0.2 | 0.5 | 0.5 |
| 2 | 80 | 40 | 40 | 3000 | 1500 | 0.6 | 1 | 1 |
| 3 | – | 80 | 80 | 3500 | 2000 | 0.8 | 2 | 2 |

FIG. 17

COATING CONDITIONS AND RESULTS IN COMPARISION EXAMPLE 1

| AMOUNT OF COATING LIQUID DISPENSED [ml] | DURATION OF COATING [sec] | $N_1$ [rpm] | $N_4$ [rpm] | $3\sigma/\langle x \rangle$[%] | VISUAL CHECK |
|---|---|---|---|---|---|
| 2.0 | 2.0 | 1200 | 694 | 2.4989 | ○ |
| 1.5 | 1.5 | 1200 | 694 | 2.2381 | ○ |
| 1.2 | 1.2 | 1200 | 694 | 2.2114 | ○ |
| 1.0 | 1.0 | 1200 | 694 | 1.867 | × |
| 0.9 | 0.9 | 1200 | 694 | 2.7301 | × |
| 0.7 | 0.7 | 1200 | 694 | 2.4546 | × |

※ VISUAL CHECK RESULT: CIRCLE MARK INDICATES THAT ENTIRE WAFER IS COATED; AND CROSS MARK INDICATES THAT EDGE PART REMAINS UNCOATED

FIG. 21

COATING CONDITIONS AND RESULTS IN COMPARISION EXAMPLE 2

| AMOUNT OF COATING LIQUID DISPENSED [ml] | DURATION OF COATING [sec] | $N_1$ [rpm] | $3\sigma/\langle x\rangle$[%] | VISUAL CHECK |
|---|---|---|---|---|
| 0.7 | 0.7 | 1500 | 3.2867 | × |
| 0.7 | 0.7 | 1700 | 4.2722 | × |
| 0.7 | 0.7 | 1800 | 4.6288 | × |
| 0.7 | 0.7 | 1900 | 4.7711 | × |
| 0.7 | 0.7 | 2000 | 6.0278 | × |
| 0.7 | 0.7 | 2500 | 9.277 | × |
| 0.7 | 0.7 | 3000 | 13.2370 | × |
| 0.7 | 0.7 | 3500 | 90.1395 | × |

※ VISUAL CHECK RESULT: CIRCLE MARK INDICATES THAT ENTIRE WAFER IS COATED; AND CROSS MARK INDICATES THAT EDGE PART REMAINS UNCOATED

FIG. 23

SPIN COATING METHOD AND SPIN COATING APPARATUS

CROSS-REFERENCE TO RELATED APPLICATION

This application is based upon and claims the benefit of priority from the prior Japanese Patent Application No. 2008-53404, filed on Mar. 4, 2008, the entire contents of which are incorporated herein by reference.

BACKGROUND OF THE INVENTION

1. Field of the Invention

The present invention relates to a spin coating method and a spin coating apparatus that involves supplying a coating liquid to a substrate and forming a coating film thereon by rotating the substrate.

2. Background Art

The spin coating method is a method of forming a coating film by dispensing a coating liquid onto a substrate and then rotating the substrate at a number of revolutions for determining the thickness of the coating film.

The spin coating method is characterized in that the thickness of the film formed depends only on the number of revolutions and is highly uniform, and the process time is short. The spin coating method has a wide variety of applications, such as manufacture of semiconductor devices or liquid crystal displays.

A first representative application is patterning by lithography. A representative lithography process in manufacture of a semiconductor device involves spin-coating a substrate with a photoresist, drying the photoresist on a hot plate, exposing the photoresist to light, and performing post baking on the hot plate. Then, the photoresist is developed using a developer to form a pattern on the substrate.

In order to prevent reflection of light from the substrate in the exposure described above, an antireflection film is also formed by spin coating. There are two types of antireflection films. One is underlies the resist, and the other overlies the resist. In addition, in order to prevent volatilization of gas from the photoresist or provide protection against contaminants in the external environment, a protective film is also formed on the photoresist by spin coating. This is common practice in the immersion exposure process.

The resist process can be classified according to the layered structure of films. For example, if a photoresist film is formed by itself, it can be classified as a single-layer resist. If a photoresist film is formed on a thick base film (organic film), it can be classified as a double-layer resist. If a photoresist film is formed on a thin layer of an inorganic material stacked on a thick base film (organic film), it can be classified as a multilayer resist. The base film and the film of an inorganic material can also be formed by spin coating.

Furthermore, photoresists are classified as an organic photoresist or an inorganic photoresist according to the composition of the material. A commonly used inorganic photoresist is the silicon-based photoresist. The photoresist film of any material can be formed by spin coating. The photoresist film may be formed on a flat substrate or a stepped substrate.

In order to further reduce the size of fine patterns, a shrinkable material is used. For example, if a shrinkable material is applied on a resist pattern having a hole, and only the shrinkable material is removed using a developer after heat treatment, the diameter of the hole can be reduced. This is because the part of the resist that thermally reacts with the shrinkable material becomes insoluble in the developer.

A second application is formation of a polyimide film. Polyimide is a thermosetting resin. A polyimide film is formed by spin-coating a substrate with a polyimide solution, drying the polyimide solution on a hot plate and making the polyimide set by thermal treatment. The film is used as a passivation film, an interlayer insulating film, a stress buffer film or the like.

Furthermore, various kinds of patterns can be formed by lithography using a photosensitive polyimide.

A third application is formation of insulating films of spin on glass (SOG) or a low-k material, which has a low dielectric constant, for example. Any of these films is made of a material primarily containing silicon and is formed by spin coating and oxidation by thermal treatment or the like. The oxidized film is used as an interlayer insulating film, a pre-metal dielectric (PMD) film or an inter-metal dielectric (IMD) film or for shallow trench isolation, for example. The material of these insulating films may be applied to a flat substrate or a stepped substrate.

A fourth application is a formation of a thin film by a sol-gel method. The sol-gel method is a method of forming a metal oxide film, a dielectric film, a ferroelectric film, a conductive film or the like by sintering an organic solution containing a metal alkoxide in a gas phase containing water. That is, a thin film is formed by performing spin coating with a metal alkoxide solution, drying the metal alkoxide solution on a hot plate and sintering the metal alkoxide. This method is used for forming a ferroelectric film for a ferroelectric memory, for example.

Such a spin coating method is used in wide variety of applications other than those described above, such as application of an organic EL material, MEMS, and manufacture of an optical material.

A representative spin coating method involves dispensing a coating liquid to a central part of a surface of a substrate at rest and then rotating the substrate to uniformly spread the coating liquid over the entire substrate. However, this method requires a large amount of coating liquid for processing one substrate.

To overcome the disadvantage, a conventional spin coating method involves dispensing a coating liquid to a semiconductor substrate while rotating the semiconductor substrate at a low number of revolutions and then forming a coating film by rotating the substrate at a number of revolutions for determining the thickness of the coating film.

The conventional spin coating method has a problem that a considerable amount of coating liquid is required, and the peripheral part of the substrate cannot be coated when the substrate has a large area.

To overcome the disadvantage, another conventional spin coating method involves setting the number of revolutions in dispensing the coating liquid higher than the number of revolutions in determining the film thickness. This method can solve the problem to some extend and can be used for a large substrate (see Japanese Patent Laid-Open Nos. 8-330206 and 2004-64071, for example).

However, the spin coating method described above has a problem that a large amount of coating liquid is used.

By the way, if the wettability of the substrate to the coating liquid is poor, the coating liquid is repelled, so that a coating unevenness occurs, and the film thickness uniformity is degraded. To prevent the degradation of the film thickness uniformity, there is proposed a precoating method that wets the substrate with a solvent (flux) before coating (see Japanese Patent Laid-Open Nos. 5-123632 and 5-243140, for example).

The spin coating method is a method that involves spin-coating a surface of a substrate with a solvent before dispensing a coating liquid and spin-coating the surface of the substrate with the coating liquid (precoating method).

The precoating method requires a smaller amount of coating liquid and can make the film thickness uniform. Therefore, the precoating method is commonly used in cutting-edge photoresist processes.

The precoating method has a disadvantage that it requires an additional solvent supplying mechanism and a larger amount of solvent. In addition, in the case where a stepped substrate or a substrate made of different kinds of materials is used, the dispensed solvent may induce a coating unevenness.

To overcome the disadvantage, another spin coating method involves dispensing a coating liquid to a substrate while rotating the substrate at a first number of revolutions and then dispensing the coating liquid to the substrate while rotating the substrate at a second number of revolutions (see Japanese Patent No. 2638969, for example). That is, according to this method, dispensing of the coating liquid is divided into two or more steps in which the substrate is rotated at different numbers of revolutions.

This spin coating method cannot sufficiently spread the coating liquid over the entire substrate and can result in an incomplete coating because the first number of revolutions is low.

On the other hand, there is a spin coating method that involves dispensing a coating liquid to a substrate while rotating the substrate at a higher first number of revolutions and then dispensing the coating liquid while rotating the substrate at a lower second number of revolutions (see Japanese Patent Laid-Open Nos. 2000-157922, 2000-279874 and 2006-156565, for example).

According to the spin coating method described in the Japanese Patent Laid-Open No. 2000-279874, the coating liquid is spread over the entire surface of the substrate when the substrate is rotated at the first number of revolutions.

To the contrary, according to the spin coating methods described in the Japanese Patent Laid-Open Nos. 2000-157922 and 2006-156565, the number of revolutions is changed from the first number of revolutions to the second number of revolutions before the coating liquid is spread over the entire surface of the substrate. However, the amount of coating liquid dispensed when the substrate rotates at the first number of revolutions is enough to coat the entire substrate, and therefore, the coating liquid dispensed when the substrate rotates at the second number of revolutions is extra. In addition, the number of revolutions after dispensing (such as the number of revolutions for determining the film thickness) is set higher than the number of revolutions during dispensing, so that an excessive amount of coating liquid is discharged to the outside of the substrate when the substrate rotates at the higher number of revolutions.

In manufacture of a semiconductor device, a circular substrate is used. To the contrary, in manufacture of a photomask substrate, a liquid crystal display or the like, a rectangular substrate is used.

However, the spin coating method can be applied to any substrates. In particular, coating a stepped substrate requires a larger amount of coating liquid than coating a flat substrate.

In addition, as the diameter of the substrate or the size of the apparatus increases, the effect of the turbulence during rotation of the substrate increases, and there arises a possibility that the substrate flies when the substrate rotates at high speed.

As a result, the maximum value of the number of revolutions is lower than that for the old type apparatus, and the number of process restrictions increases.

SUMMARY OF THE INVENTION

According to one aspect of the present invention, there is provided: a spin coating method that supplies a coating liquid to a substrate and rotating the substrate to form a coating film, comprising:

dispensing a first amount of coating liquid to a central part of the substrate while rotating the substrate about the central part of the substrate at a first number of revolutions;

dispensing a second amount of coating liquid to the central part of the substrate while rotating the substrate at a second number of revolutions that is lower than the first number of revolutions after dispensing the first amount of coating liquid; and rotating the substrate at a third number of revolutions for determining the film thickness of the coating liquid after dispensing the second amount of coating liquid, wherein the first number of revolutions is a number of revolutions at which the first amount of coating liquid does not uniformly spread over the substrate because of air resistance.

According to other aspect of the present invention, there is provided: a spin coating apparatus that supplies a coating liquid to a substrate and rotating the substrate to form a coating film, comprising:

a holding part that holds the substrate mounted thereon in a horizontal position;

a rotationally driving source that rotationally drives the holding part about a rotational axis parallel with the vertical direction, thereby rotating the substrate; and a coating liquid supplying part that supplies the coating liquid to the substrate held by the holding part, wherein the coating liquid supplying part dispenses a first amount of coating liquid to a central part of the substrate while the rotationally driving source is rotating the substrate about the central part of the substrate at a first number of revolutions, the coating liquid supplying part dispenses a second amount of coating liquid to the central part of the substrate while the rotationally driving source is rotating the substrate at a second number of revolutions that is lower than the first number of revolutions after the first amount of coating liquid is dispensed, the rotationally driving source rotates the substrate at a third number of revolutions for determining the film thickness of the coating liquid after the second amount of coating liquid is dispensed, and the first number of revolutions is a number of revolutions at which the first amount of coating liquid does not uniformly spread over the substrate because of air resistance.

BRIEF DESCRIPTION OF THE DRAWINGS

FIG. 5 shows an exemplary recipe for the spin coating method according to the embodiment 1;

FIG. 8 is a table showing the in-plane uniformity 3σ/<x> of the thickness and the result of visual check of coating films formed by changing the first number of revolutions "$N_1$" and the second number of revolutions "$N_2$";

FIG. 9 is a table showing the in-plane uniformity 3σ/<x> of the thickness and the result of visual check of coating films formed by changing the first and second discharge rates "$V_1$" and "$V_2$";

FIG. 10 is a table showing the in-plane uniformity 3σ/<x> of the thickness and the result of visual check of coating films formed by changing the first and second amounts "$M_1$" and "$M_2$";

FIG. 12 is a table showing the in-plane uniformity 3σ/<x> of the thickness and the result of visual check of coating films formed by changing the acceleration and deceleration of discharge of the coating liquid;

FIG. 17 is a figure showing an allocation of the L18 orthogonal table.

FIG. 21 is a table showing the in-plane uniformity 3σ/<x> of the thickness and the result of visual check of coating films formed by changing the amount of coating liquid dispensed according to the coating sequence of the comparison example 1;

FIG. 23 is a table showing the in-plane uniformity 3σ/<x> of the thickness and the result of visual check of coating films formed by changing the first number of revolutions "$N_1$" according to the coating sequence shown in FIG. 20.

DETAILED DESCRIPTION

As the diameter of the substrate increases, the sensitivity of the spin coating method to the atmosphere when the substrate is rotating also increases. In particular, at the peripheral part of the substrate, the atmospheric resistance is high, and thus it becomes more difficult to spread the coating liquid as the number of revolutions increases.

Figure 1A:
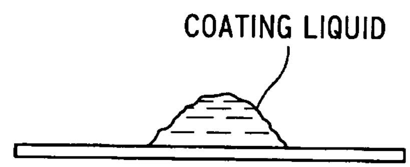
FIG. 1A is a cross-sectional view showing a distribution of a coating liquid immediately after the coating liquid is dispensed to the center of a substrate when the substrate is rotating at low speed.
Figure 1B:
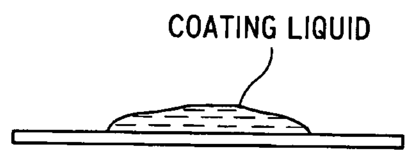
FIG. 1B is a cross-sectional view showing a distribution of the coating liquid when a certain length of time have elapsed after the state shown in FIG. 1A.
Figure 1C:
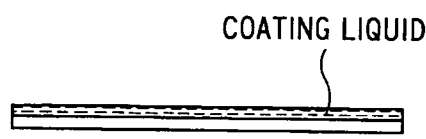
FIG. 1C is a cross-sectional view showing a distribution of the coating liquid when a certain length of time have elapsed after the state shown in FIG. 1A.

FIG. 1A is a cross-sectional view showing a distribution of a coating liquid immediately after the coating liquid is dispensed to the center of a substrate when the substrate is rotating at low speed. FIGS. 1B and 1C are cross-sectional views showing distributions of the coating liquid when certain lengths of time have elapsed after the state shown in FIG. 1A.

In the case where coating is performed by rotating the substrate at low speed, uniform coating over the entire surface of the substrate can be accomplished as shown in FIG. 1C by transition from the state shown in FIG. 1A to the state shown in FIG. 1B and then to the state shown in FIG. 1C.

However, in the case where the substrate is rotated at high speed, the coating liquid spreads in a different way from the case of low-speed rotation described above.

Figure 2A:
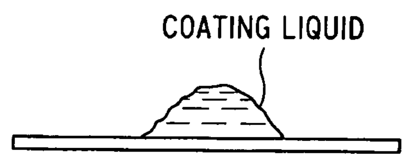
FIG. 2A is a cross-sectional view showing a distribution of a coating liquid immediately after the coating liquid is dispensed to the center of a substrate when the substrate is rotating at high speed.
Figure 2B:
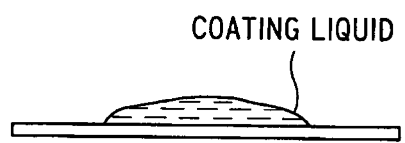
FIG. 2B is a cross-sectional view showing a distribution of the coating liquid when a certain length of time have elapsed after the state shown in FIG. 2A.

FIG. 2A is a cross-sectional view showing a distribution of a coating liquid immediately after the coating liquid is dispensed to the center of a substrate when the substrate is rotating at high speed. FIGS. 2B to 2F are cross-sectional views showing distributions of the coating liquid when certain lengths of time have elapsed after the state shown in FIG. 2A.

In the case of high-speed rotation, the coating liquid spreads in a similar way to the case of low-speed rotation immediately after the coating liquid is dispensed. That is, the coating liquid spreads by transition from the state shown in FIG. 2A to the state shown in FIG. 2B.

Figure 2C:
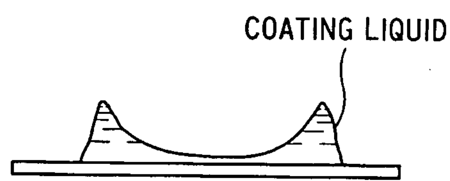
FIG. 2C is a cross-sectional view showing a distribution of the coating liquid when a certain length of time have elapsed after the state shown in FIG. 2A.

However, before the coating liquid reaches the peripheral part of the substrate, the coating liquid experiences the atmospheric resistance, and the edge of the coating liquid is swollen (FIG. 2C).

When the substrate is rotating at high speed, the coating liquid cannot move on the substrate from the state shown in FIG. 2C and thus is spattered to the peripheral part or outside of the substrate. Even if the duration of the rotation is elongated, the coating liquid cannot be further moved to spread on the substrate.

Figure 2D:
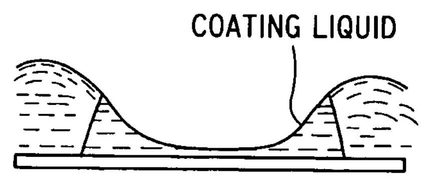
FIG. 2D is a cross-sectional view showing a distribution of the coating liquid when a certain length of time have elapsed after the state shown in FIG. 2A.
Figure 2E:
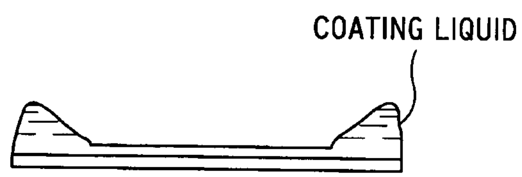
FIG. 2E is a cross-sectional view showing a distribution of the coating liquid when a certain length of time have elapsed after the state shown in FIG. 2A.
Figure 2F:
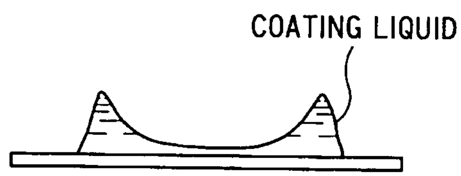
FIG. 2F is a cross-sectional view showing a distribution of the coating liquid when a certain length of time have elapsed after the state shown in FIG. 2A.

Therefore, as shown in FIGS. 2D to 2F, the spattered coating liquid is accumulated at the peripheral part of the substrate, or no coating liquid exists at the peripheral part of the substrate.

Figure 3A:
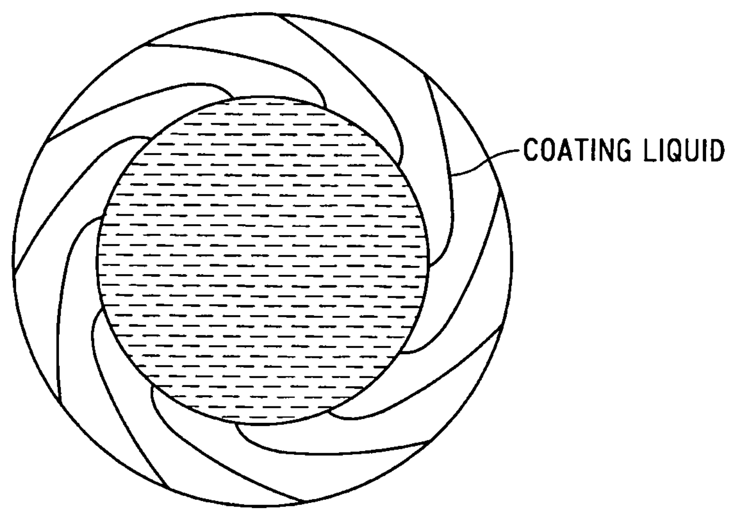
FIG. 3A is a top plan view of the substrate in the state shown in FIG. 2D.
Figure 3B:
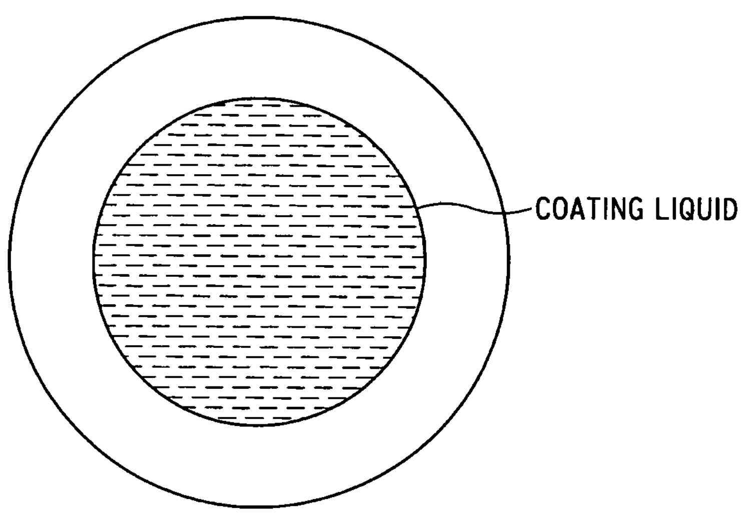
FIG. 3B is a top plan view of the substrate in the state shown in FIG. 2F.

FIG. 3A is a top plan view of the substrate in the state shown in FIG. 2D. FIG. 3B is a top plan view of the substrate in the state shown in FIG. 2F.

In some cases, as shown in FIG. 3A, at the peripheral part of the substrate, the coating liquid may be streaked by the effect of the atmospheric resistance. In other cases, as shown in FIG. 3B, the coating liquid may be swollen by the spattered coating liquid in an area of the coated part close to the boundary between the coated part and the peripheral part of the substrate.

As described above, even if an amount of coating liquid enough to coat over the entire surface of the substrate when the substrate is rotating at low speed is dispensed, the coating liquid cannot practically be spread over the entire surface of the substrate when the substrate is rotating at high speed.

Thus, according to an embodiment of the present invention, (1) a first amount "$M_1$" of coating liquid is dispensed to a central part of the substrate while rotating the substrate at a first number of revolutions "$N_1$", at which the coating liquid cannot practically spread over the entire substrate.

The number of revolutions of the substrate has to be enough for the coating liquid to experience a sufficient atmospheric resistance at the peripheral part of the substrate. For example, when the substrate has a diameter of 300 mm, the number of revolutions is preferably equal to or higher than 3000 rpm.

This process can keep the peripheral part of the substrate substantially uncoated. As the number of revolutions increases, the time taken for the coating liquid to reach the boundary between the coated part and the uncoated part decreases, and the amount of swelling of the coating liquid at the edge thereof increases. The first amount "$M_1$" is preferably a small amount that does not suffice for coating the entire substrate even when the substrate is rotating at low speed.

Then, (2) a second amount "$M_2$" of coating liquid is dispensed while rotating the substrate at a second number of revolutions "$N_2$", which is lower than the first number of revolutions "$N_1$". The dispensing process (1) and the dispensing process (2) are preferably carried out successively.

The coating liquid that has spread partway on the substrate when the substrate is rotating at the first number of revolutions is further pushed toward the peripheral part when the dispensing process (2) is carried out. In this process, since the second number of revolutions is lower than the first number of revolutions, the air resistance at the peripheral part is reduced, so that the coating liquid can more easily move toward the peripheral part.

In addition, the coating liquid can move by reducing the height of the swelling at the edge thereof, so that the coating liquid forming the swelling can be used to coat the peripheral part.

Therefore, a large second amount is not needed, and the second amount "$M_2$" can be smaller than the first amount "$M_1$". In this way, the coating liquid is spread over the entire surface of the substrate or to the vicinity of the peripheral part of the substrate.

Then, (3) the substrate is rotated at a number of revolutions that produces a predetermined thickness, thereby controlling the thickness of the coating liquid to be a predetermined value.

Before the process (3) of rotating the substrate is carried out, for example, reflow can be carried out at a very low number of revolutions of 100 rpm or so for several seconds.

Then, edge cutting is carried out, and baking is carried out to evaporate the solvent to complete the formation of the coating film.

In this way, the entire surface of the substrate can be coated with a small amount of coating liquid.

In the following, embodiments of the present invention will be described with reference to the drawings.

(Embodiment 1)

Figure 4:
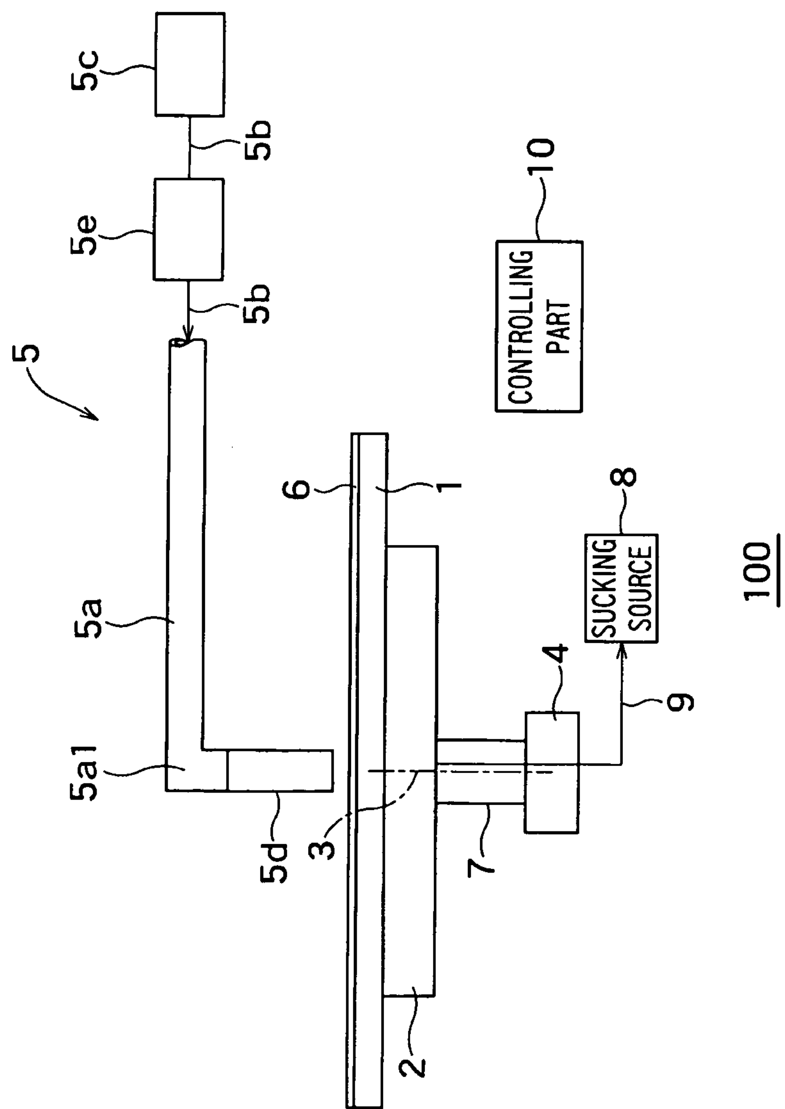
FIG. 4 is a diagram showing a configuration of essential parts of a spin coating apparatus 100 according to an embodiment 1 of the present invention.

FIG. 4 is a diagram showing a configuration of essential parts of a spin coating apparatus 100 according to an embodiment 1 of the present invention, which is an aspect of the present invention.

As shown in FIG. 4, the spin coating apparatus 100 has a holding part 2 that holds a wafer 1, which is a substrate, mounted thereon in a horizontal position, a motor 4 that is a rotationally driving source that rotationally drives the holding part 2 about a rotational axis 3 parallel with the vertical direction to rotate the wafer 1, a coating liquid supplying part 5 that supplies a coating liquid to the wafer 1 held by the holding part 2, and a controlling part 10.

As shown in FIG. 4, a spin coating method according to this embodiment is used to dispense the coating liquid to one of the opposite surfaces of the wafer 1 in the thickness direction (referred to simply as front surface, hereinafter) to form a coating film 6, for example.

In particular, the spin coating method according to this embodiment is suitably used in a case where the coating liquid used is made of an organic material, inorganic material or the like that has a viscosity equal to or higher than 0.1 mPa*s and equal to or lower than 1000 mPa*s. However, the viscosity may be out of the range.

The wafer 1 is held by the holding part 2 in such a manner that the other surface thereof (referred to simply as back surface, hereinafter) is in contact with the holding part 2. The wafer 1 used in this embodiment is a circular substrate, and the diameter is 300 mm, for example. However, the shape of the wafer 1 is not limited thereto, and other polygonal shapes, such as a rectangular shape, are possible. The wafer 1 is mounted on the holding part 2 in such a manner that a central part thereof is located on the rotational axis 3.

The holding part 2 is connected to a sucking source 8 via a vacuum line 9. The wafer 1 mounted on the holding part 2 is held by vacuum suction by the suction force of the sucking source 8.

The motor 4 has a rotating shaft 7. The holding part 2 is fixed to the rotating shaft 7. The motor 4 is capable of changing the rotational speed.

The coating liquid supplying part 5 has an arm **5*a*. A coating liquid supplying source 5*c* is connected to the arm 5*a* via a coating liquid supplying pipe 5*b*. The arm 5*a* has a nozzle 5***d* opening toward the holding part 2, or in other words, downward in the sheet of FIG. 4 at a free end 5*a* l thereof.

The arm 5*a* is connected to an arm operating mechanism (not shown). The arm operating mechanism has capabilities of moving the nozzle 5*d* from a storage site for the nozzle 5*d* at a distance from the wafer 1 (not shown) to a central part of the wafer where the coating liquid is to be dispensed and of adjusting the vertical position of the nozzle 5*d* at the position where the coating liquid is to be dispensed.

A discharge controlling apparatus 5*e* that adjusts the flow rate of the coating liquid is disposed between the coating liquid supplying source 5*c* and the arm 5*a*. The discharge controlling apparatus 5*e* is implemented by a pressure pump, for example.

The coating liquid supplied from the coating liquid supplying source 5*c* is a photoresist when the coating film 6 to be formed is a resist film, for example.

However, the coating liquid is not limited to the photoresist and may be an antireflection material, a photoresist protective material, a resist pattern shrinkable material, a protective material for immersion exposure, polyimide, SOG, a low-k material or a sol-gel material, for example.

Alternatively, the coating liquid may be a photoresist-underlying layer material or a photoresist-overlying layer material. Alternatively, the coating liquid may be a planarizing material or a filler material.

The controlling part 10 has a computer or the like, has a capability of controlling the operation of each part of the spin coating apparatus 100 and can be programmed by an operator to make the wafer processing smoother, for example. The controlling part 10 can additionally has a capability of monitoring the operation of the spin coating apparatus 100. More specifically, the controlling part 10 controls the speed or duration of rotation of the motor 4 that rotationally drives the holding part 2, for example. Furthermore, the controlling part 10 controls the operation of the discharge controlling apparatus 5*e* that adjusts the amount of coating liquid supplied to the arm 5*a* of the coating liquid supplying part 5.

Furthermore, the controlling part 10 controls the operation of the arm 5*a* of the coating liquid supplying part 5.

Next, exemplary conditions for the spin coating method implemented by the spin coating apparatus 100 configured as described above will be described.

Figure 6:
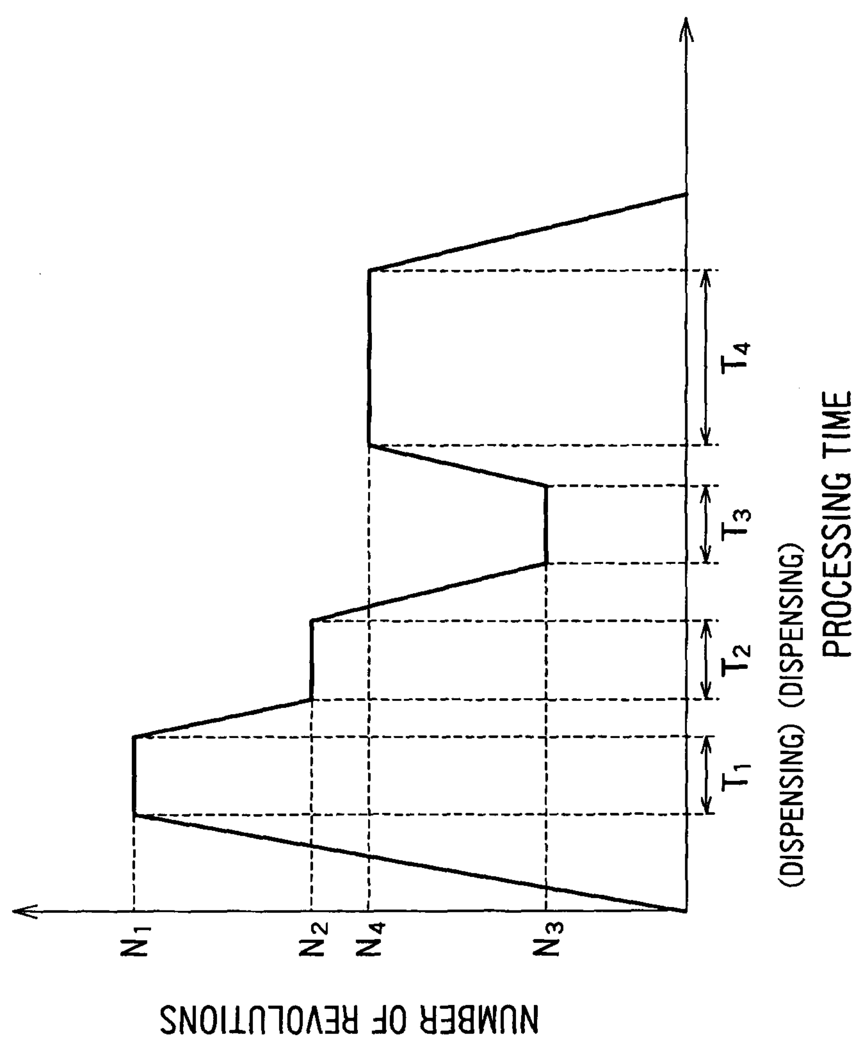
FIG. 6 is a diagram showing an exemplary sequence of operation of the spin coating apparatus 100 according to the recipe shown in FIG. 5.
Figure 7:
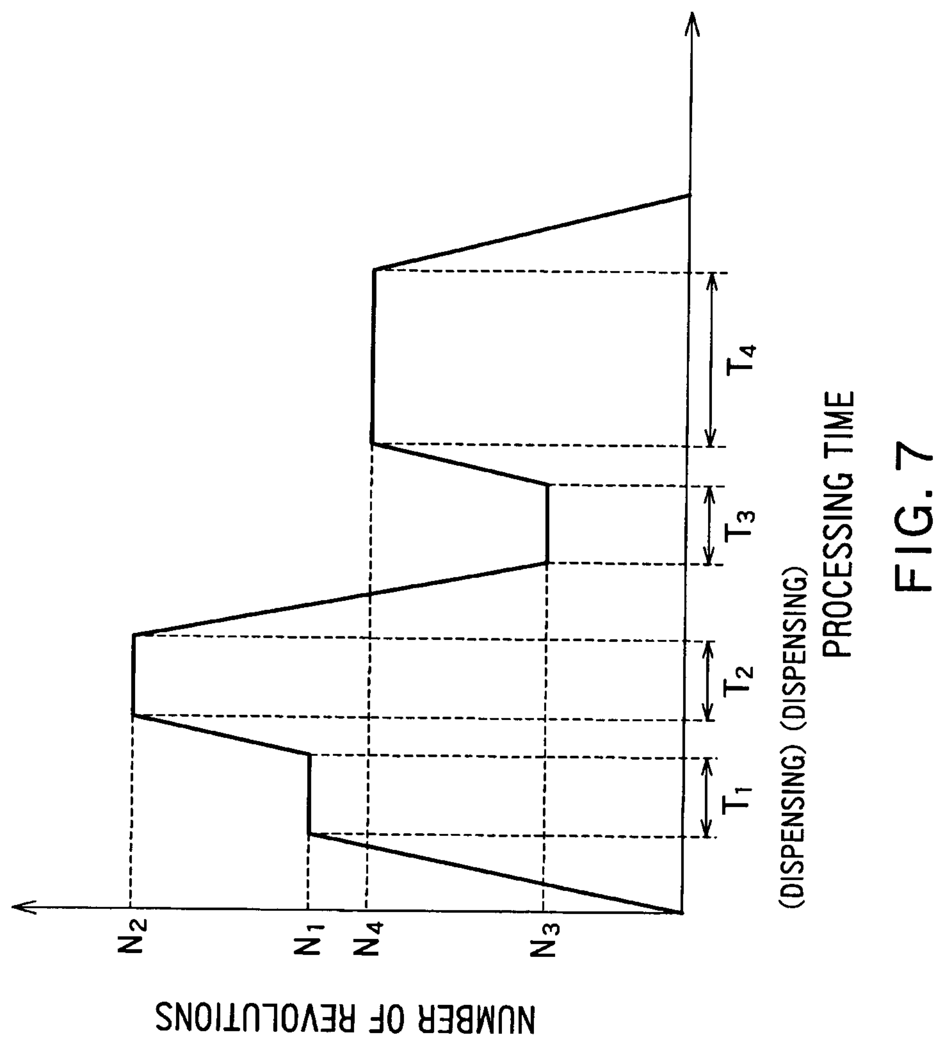
FIG. 7 is a diagram showing another exemplary sequence of operation of the spin coating apparatus 100 according to the recipe shown in FIG. 5.

FIG. 5 shows an exemplary recipe for the spin coating method according to the embodiment 1. FIG. 6 is a diagram showing an exemplary sequence of operation of the spin coating apparatus 100 according to the recipe shown in FIG. 5. FIG. 7 is a diagram showing another exemplary sequence of operation of the spin coating apparatus 100 according to the recipe shown in FIG. 5. In the experiment in this embodiment, a material having a viscosity of 1 mPa*s is used as the coating material.

In FIG. 6, it is supposed that the first number of revolutions "$N_1$" is higher than the second number of revolutions "$N_2$". On the other hand, in FIG. 7, it is supposed that the first number of revolutions "$N_1$" is lower than the second number of revolutions "$N_2$".

As shown in FIGS. 6 and 7, first, the coating liquid is dispensed while the wafer is rotated at the first number of revolutions "$N_1$" (step S1).

That is, in the spin coating apparatus 100, the motor 4 rotates the wafer 1 about the central part thereof at the first number of revolutions "$N_1$", and at the same time, the coating liquid supplying part 5 dispenses the first amount "$M_1$" of coating liquid to the central part of the wafer 1.

The first number of revolutions "$N_1$" is set at a value at which the first amount "$M_1$" of coating liquid does not uniformly spread over the entire substrate because of the air resistance. For example, in a case where the substrate (wafer) has a diameter of 300 mm, as described later, the first number of revolutions "$N_1$" is set at 3000 rpm, and the first amount "$M_1$" is set at 0.4 ml. The state in which the first amount "$M_1$" of coating liquid does not uniformly spread over the entire substrate because of the air resistance is any of the states shown in FIGS. 2D to 2F described above, for example.

Then, the wafer 1 is rotated at the second number of revolutions "$N_2$", and the coating liquid is further dispensed (step S2). Steps 1 and 2 of dispensing of coating liquid can be carried out successively.

More specifically, referring to FIG. 6, in the spin coating apparatus 100, after the first amount "$M_1$" of coating liquid is dispensed, the coating liquid supplying part 5 dispenses the second amount "$M_2$" of coating liquid to the central part of the wafer 1 while the motor 4 is rotating the wafer 1 at the second number of revolutions "$N_2$" lower than the first number of revolutions "$N_1$". On the other hand, referring to FIG. 7, in the spin coating apparatus 100, after the first amount "$M_1$" of coating liquid is dispensed, the coating liquid supplying part 5 dispenses the second amount "$M_2$" of coating liquid to the central part of the wafer 1 while the motor 4 is rotating the wafer 1 at the second number of revolutions "$N_2$" higher than the first number of revolutions "$N_1$".

Then, a reflow processing is carried out by rotating the wafer 1 at a number of revolutions "$N_3$" (step S3). The reflowing processing improves the uniformity of the thickness of the film of the coating liquid on the wafer 1.

Then, a processing of determining the film thickness is carried out by rotating the wafer 1 at a number of revolutions "$N_4$" (step S4).

That is, in the spin coating apparatus 100, after the second amount "$M_2$" of coating liquid is dispensed, the motor 4 rotates the wafer 1 at a third number of revolutions for determining the thickness of the film of the coating liquid. Thus, the thickness of the coating film formed on the wafer 1 is controlled to be a desired value.

After the coating liquid is applied to the substrate as described above, the spin coating apparatus 100 carries out edge cutting with a thinner (not shown), and the substrate is automatically transferred to a hot plate, baked and then cooled down.

Next, a result of analysis of variations of coating characteristics in the case where the rotational speed of the substrate is changed will be described.

Of the conditions in the recipe shown in FIG. 5, the first number of revolutions "$N_1$", the duration "$T_1$" of dispensing of the coating liquid, and the second number of revolutions "$N_2$" and the duration "$T_2$" of dispensing of the coating liquid are changed, and coating films formed by the flows shown in FIGS. 6 and 7 are analyzed.

FIG. 8 is a table showing the in-plane uniformity $3\sigma/\langle x\rangle$ of the thickness and the result of visual check of coating films formed by changing the first number of revolutions "$N_1$" and the second number of revolutions "$N_2$".

The wafer used is a circular silicon substrate having a diameter of 300 mm on which no pattern is formed. The number of revolutions "$N_3$" in step S3 is fixed at 100 rpm, and the number of revolutions "$N_4$" in step S4 is fixed at 694 rpm. The duration of coating in step S1 is 0.4 seconds (the amount of coating liquid dispensed is 0.4 ml), the duration of coating in step S2 is 0.3 seconds (the amount of coating liquid dispensed is 0.3 ml), and the total duration of coating is 0.7 seconds (the total amount of coating liquid dispensed is 0.7 ml).

As shown in FIG. 8, when the first number of revolutions "$N_1$" is high, and the second number of revolutions "$N_2$" is low, the unevenness of coating is reduced, and the wafer edge can be coated. In particular, as the difference between the first number of revolutions "$N_1$" and the second number of revolutions "$N_2$" increases, the in-plane uniformity of the film thickness is improved.

Therefore, to coat the entire surface (or a wider area) of the wafer, it can be effective to set the first number of revolutions "$N_1$" higher than the second number of revolutions "$N_2$".

Next, a result of analysis of variations of coating characteristics in the case where the rate of discharge of the coating liquid is changed will be described.

Of the conditions for the recipe shown in FIG. 5, the discharge rate "$V_1$" in step SI and the discharge rate "$V_2$" in step S2 are changed, and coating films formed by the flow shown in FIG. 6 are analyzed.

FIG. 9 is a table showing the in-plane uniformity $3\sigma/\langle x\rangle$ of the thickness and the result of visual check of coating films formed by changing the first and second discharge rates "$V_1$" and "$V_2$".

The wafer used is a circular silicon substrate having a diameter of 300 mm on which no pattern is formed. In each of steps S1 and S2, the discharge rate in dispensing the coating liquid (dispensing rate) is set at 0.5 ml/second, 1.0 ml/second and 2.0 ml/second. Coating is performed under the conditions that the number of revolutions "$N_1$" and the amount of coating liquid dispensed in step S1 are 3000 rpm and 0.6 ml, respectively, the number of revolutions "$N_2$" and the amount of coating liquid dispensed in step S2 are 1500 rpm and 0.4 ml, respectively, the number of revolutions "$N_3$" in step S3 is 100 rpm, and the number of revolutions "$N_4$" in step S4 is 694 rpm.

As shown in FIG. 9, when the discharge rate "$V_1$" in step S1 is set at 2.0 ml/second, and the discharge rate "$V_2$" in step S2 is set at 1.0 ml/second, the edge part of the wafer can be coated with the coating liquid. Furthermore, under this condition, the best in-plane uniformity of the film thickness results.

That is, the discharge rate "$V_1$" in step S1 has no effect on the coating evenness or the in-plane uniformity of the film thickness. However, as the discharge rate "$V_2$" in step S2 increases, the coating unevenness is reduced, and the film thickness uniformity is improved.

Next, a result of analysis of variations of coating characteristics in the case where the amount of coating liquid dispensed (discharged) is changed will be described.

Of the conditions for the recipe shown in FIG. 5, the first amount "$M_1$" in step SI and the second amount "$M_2$" in step S2 are changed, and coating films formed by the flow shown in FIG. 6 are analyzed.

Figure 11:
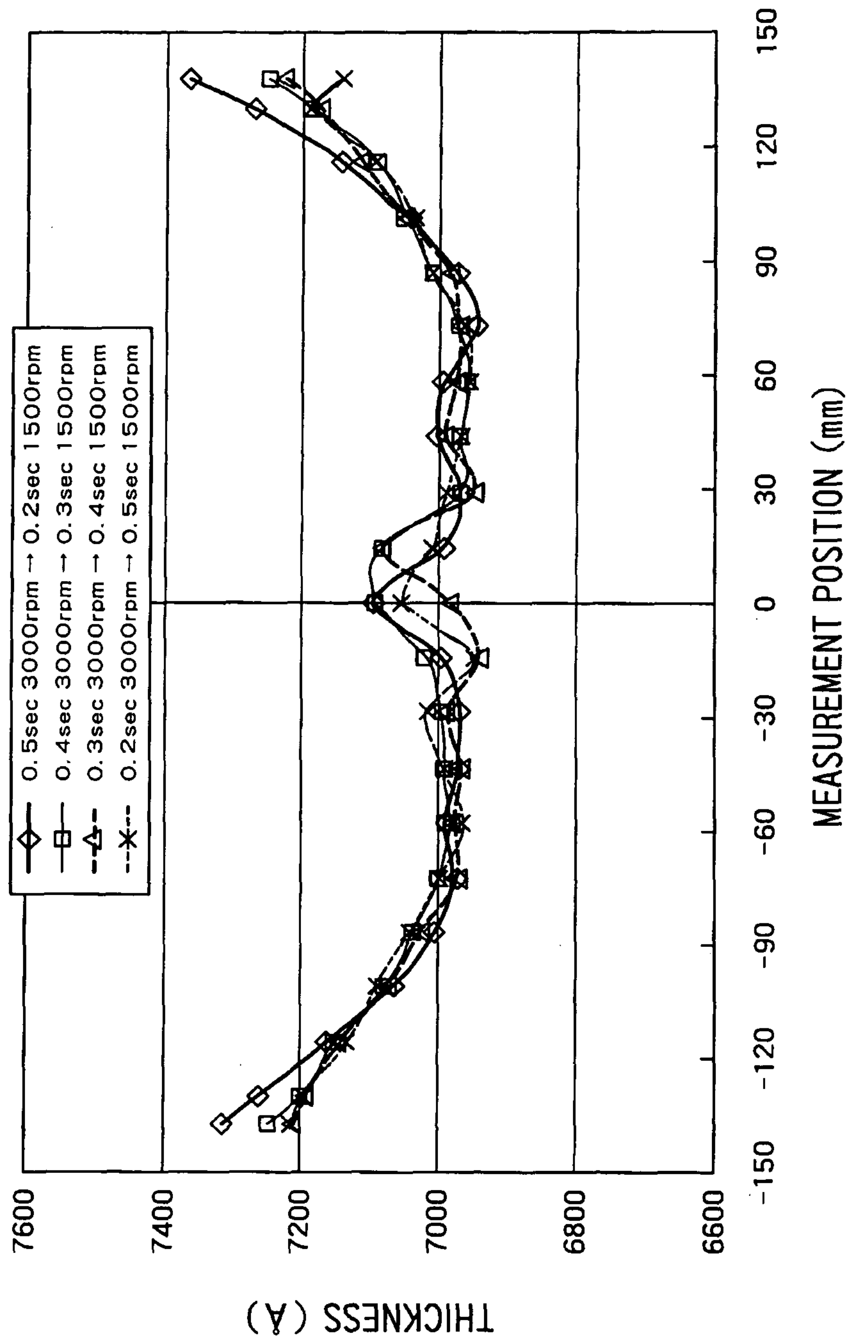
FIG. 11 is a graph showing relationships between the thickness of coating films formed by changing the first and second amount "$M_1$" and "$M_2$" and the measurement position thereof in the wafer surface.

FIG. 10 is a table showing the in-plane uniformity $3\sigma/\langle x\rangle$ of the thickness and the result of visual check of coating films formed by changing the first and second amounts "$M_1$" and "$M_2$". FIG. 11 is a graph showing relationships between the thickness of coating films formed by changing the first and second amount "$M_1$" and "$M_2$" and the measurement position thereof in the wafer surface.

The wafer used is a circular silicon substrate having a diameter of 300 mm on which no pattern is formed. When the wafer is rotating at the first number of revolutions "$N_1$", the coating liquid is dispensed in amounts of 0.2 ml to 0.5 ml and when the wafer is rotating at the second number of revolutions "$N_2$", the coating liquid is dispensed in amounts of 0.5 ml to 0.2 ml. The total amount of coating liquid dispensed is set at 0.7 ml. The first number of revolutions "$N_1$" is set at 3000 rpm, and the second number of revolutions "$N_2$" is set at 1500 rpm.

As shown in FIG. 10, when the first amount "$M_1$" is small, and the second amount "$M_2$" is large, the coating film cannot be formed in the edge part of the wafer.

On the other hand, when the first amount "$M_1$" is large, and the second amount "$M_2$" is small, the coating film can be formed in the edge part of the wafer. In particular, under the conditions that the first amount "$M_1$" is 0.4 ml, and the second amount "$M_2$" is 0.3 ml, the best result is obtained in terms of visual check and in-plane uniformity of the film thickness.

As described above, to coat the entire surface (or a wider area) of the wafer with the coating liquid, the duration "$T_1$" has to be longer than the duration "$T_2$", or in other words, the first amount "$M_1$" has to be larger than the second amount "$M_2$".

Next, a result of analysis of variations in coating characteristics in the case where the acceleration and deceleration of discharge of the coating liquid are changed will be described.

Of the conditions for the recipe shown in FIG. 5, the acceleration and deceleration of discharge of the coating liquid in step S1 and the acceleration and deceleration of discharge of the coating liquid in step S2 are changed, and coating films formed by the flow shown in FIG. 6 are analyzed.

Figure 13:
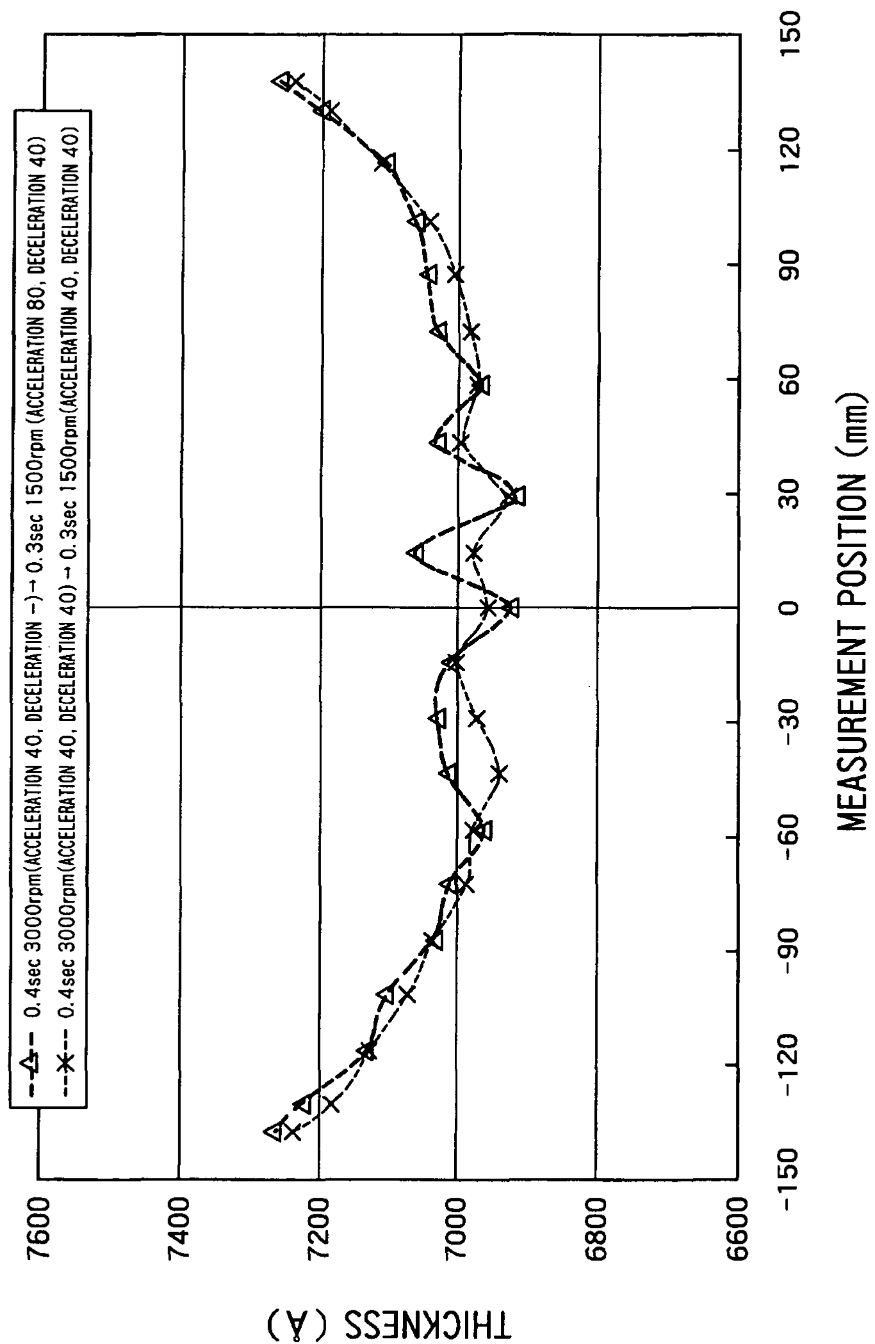
FIG. 13 is a graph showing relationships between the thickness of coating films formed by changing the acceleration and deceleration of discharge of the coating liquid and the measurement position thereof in the wafer surface.

FIG. 12 is a table showing the in-plane uniformity $3\sigma/\langle x\rangle$ of the thickness and the result of visual check of coating films formed by changing the acceleration and deceleration of discharge of the coating liquid. FIG. 13 is a graph showing relationships between the thickness of coating films formed by changing the acceleration and deceleration of discharge of the coating liquid and the measurement position thereof in the wafer surface.

The wafer used is a circular silicon substrate having a diameter of 300 mm on which no pattern is formed. When the coating liquid is dispensed for 0.4 seconds while the wafer is rotating at the first number of revolutions "$N_1$", the acceleration of discharge is set at 40 ml/second$^2$, and the deceleration of stopping discharge is set at 0 (no deceleration) or 40 ml/second$^2$. Then, when the wafer is rotating at the second number of revolutions "$N_2$", the acceleration of discharge is set at 80 ml/second$^2$ or 40 ml/second$^2$, and the deceleration of stopping discharge is set at 40 ml/second$^2$. The first number of revolutions "$N_1$" is set at 3000 rpm, and the second number of revolutions "$N_2$" is set at 1500 rpm.

As shown in FIG. 12, there is no significant difference in numerical value. However, the visual check shows that the coating unevenness in the peripheral part is reduced when discharge is not decelerated in step S1, and the acceleration of discharge is raised in step S2 (or in other words, discharge is successively and smoothly carried out).

Next, a result of analysis of variations of the thickness of the coating film in the case where the first amount "$M_1$" is fixed, and the first number of revolutions "$N_1$" is changed will be described.

Figure 14:
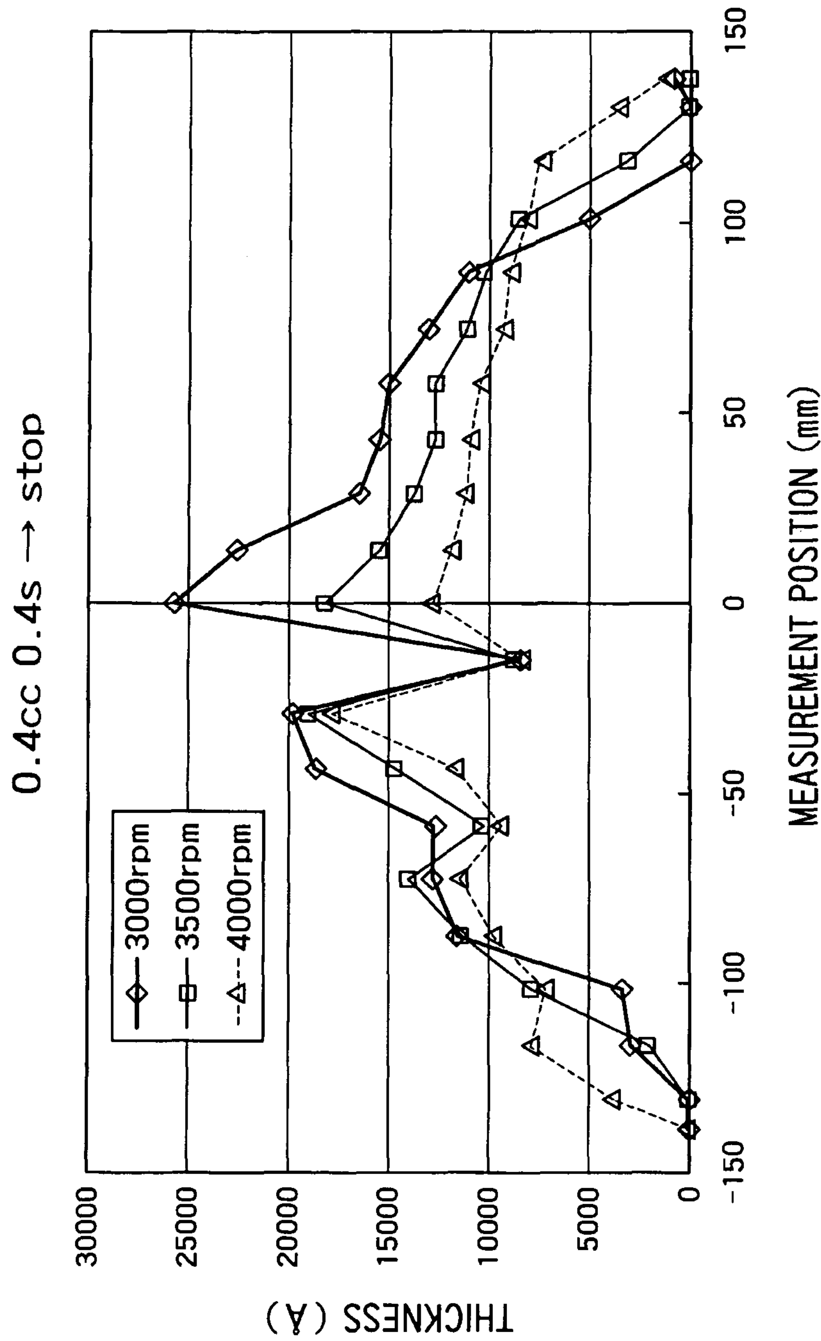
FIG. 14 is a graph showing relationships between the thickness of coating films formed by changing the first number of revolutions "$N_1$" and the measurement position thereof.

FIG. 14 is a graph showing relationships between the thickness of coating films formed by changing the first number of revolutions "$N_1$" and the measurement position thereof. The wafer used is a circular silicon substrate having a diameter of 300 mm on which no pattern is formed.

FIG. 14 shows three cases where the first number of revolutions "$N_1$" is 3000 rpm, 3500 rpm and 4000 rpm. The amount of coating liquid dispensed (the first amount "$M_1$") and the duration of coating are 0.4 ml and 0.4 seconds, respectively, which produce the best result under the conditions described earlier. The thickness of the coating film is measured after the coating film is baked to remove the solvent of the coating liquid dispensed.

As shown in FIG. 14, when the amount of coating liquid dispensed is 0.4 ml, as the number of revolutions increases, the edge of the coating film moves outwardly. However, the coating film does not spread over the entire surface of the substrate.

Next, a result of analysis of variations of the thickness of the coating film in the case where the first amount "$M_1$" is fixed, and the first number of revolutions "$N_1$" is changed will be described.

As described above, after 0.4 ml of coating liquid is dispensed onto the silicon substrate while rotating the silicon substrate at the first number of revolutions "$N_1$" of 3000 rpm or 4000 rpm, the substrate is rotated for 10 or more seconds at the same number of revolutions and then baked.

Figure 15:
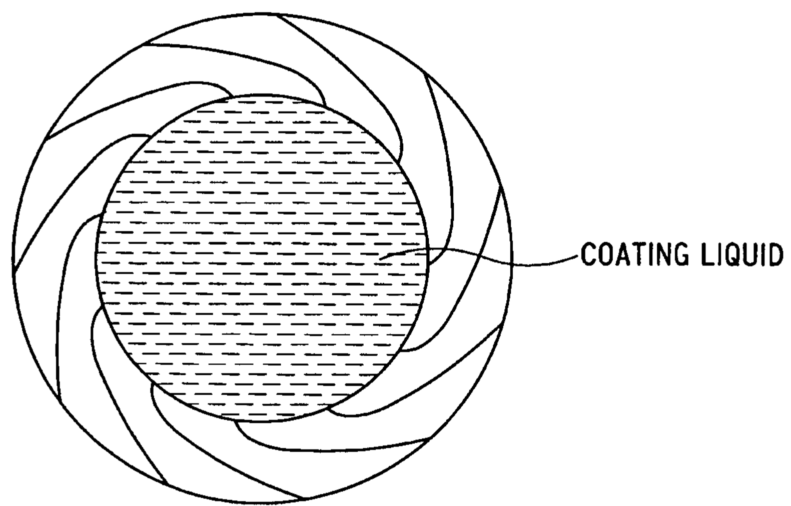
FIG. 15 is a top plan view of the substrate on which 0.4 ml of coating liquid is dispensed.
Figure 16A:
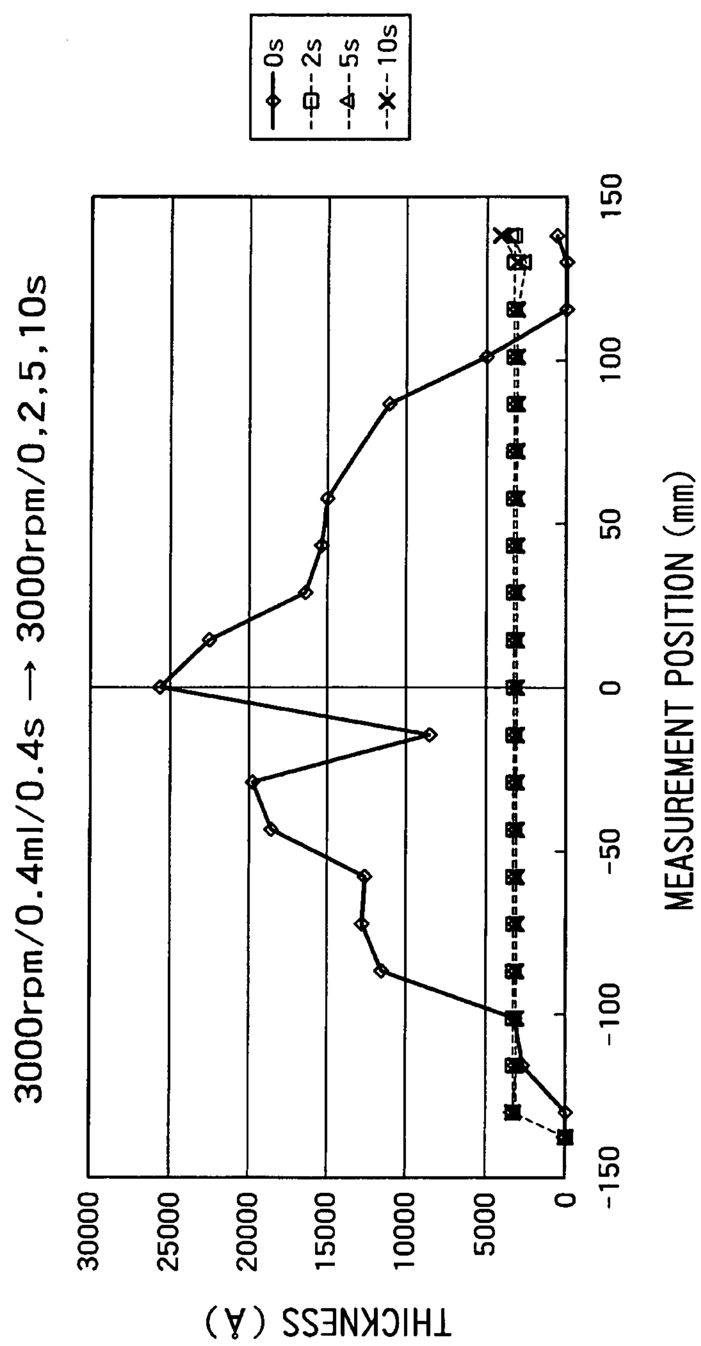
FIG. 16A is a graph showing relationships between the thickness of coating films formed by changing the duration of rotation at the first number of revolutions "$N_1$" of 3000 rpm and the measurement position thereof.
Figure 16B:
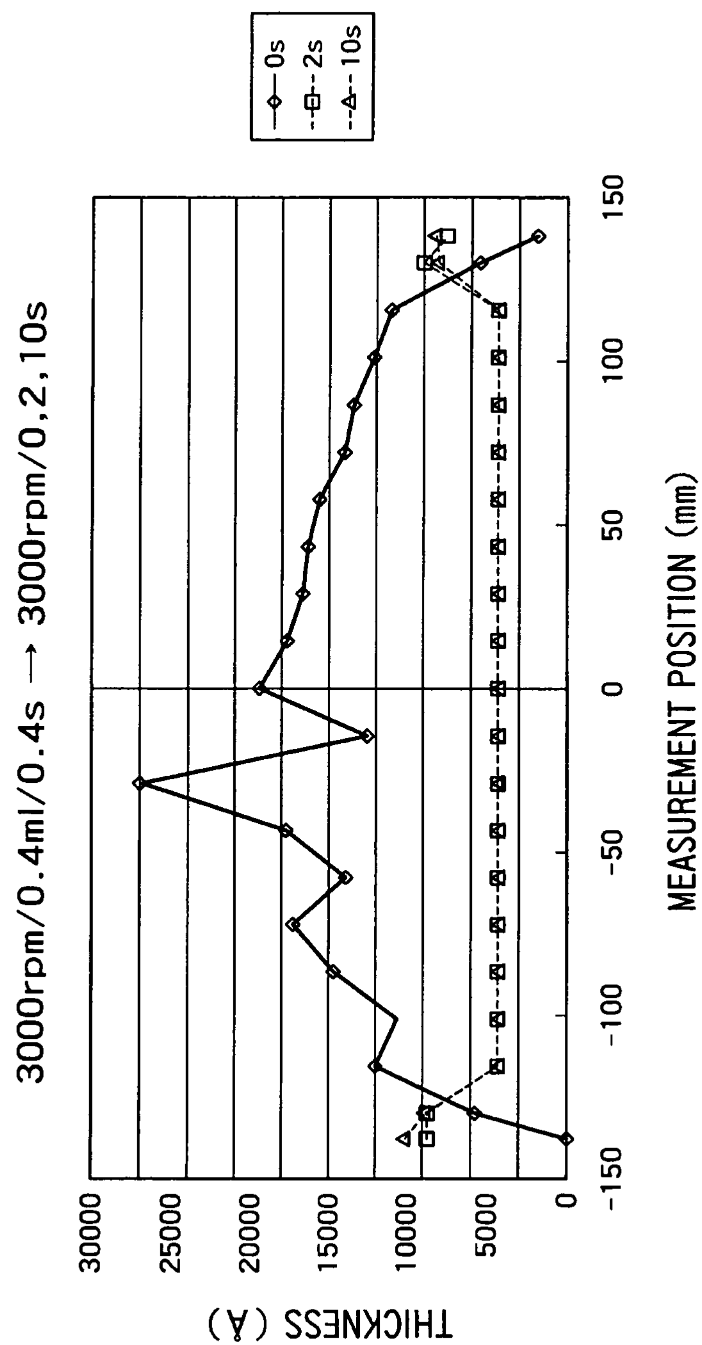
FIG. 16B is a graph showing relationships between the thickness of coating films formed by changing the duration of rotation at the first number of revolutions "$N_1$" of 4000 rpm and the measurement position thereof.

FIG. 15 is a top plan view of the substrate on which 0.4 ml of coating liquid is dispensed. FIG. 16A is a graph showing relationships between the thickness of coating films formed by changing the duration of rotation at the first number of revolutions "$N_1$" of 3000 rpm and the measurement position thereof. FIG. 16B is a graph showing relationships between the thickness of coating films formed by changing the duration of rotation at the first number of revolutions "$N_1$" of 4000 rpm and the measurement position thereof. The wafer used is a circular silicon substrate having a diameter of 300 mm on which no pattern is formed.

Regardless of whether the first number of revolutions "$N_1$" is 3000 rpm or 4000 rpm, the coating film is formed as shown in FIG. 15, and the coating liquid at the peripheral part of the substrate is streaked by the effect of the air resistance.

As shown in FIG. 16A, when the first number of revolutions "$N_1$" is 3000 rpm, it is observed that no coating film is formed in the peripheral part of the wafer, or any coating film formed in the peripheral part of the wafer has a larger thickness than in the central part thereof because the coating liquid is spattered to the peripheral part of the wafer and accumulated there.

As shown in FIG. 16B, when the first number of revolutions "$N_1$" is 4000 rpm, it is observed that any coating film formed in the peripheral part of the wafer has a larger thickness than in the central part thereof because the coating liquid is spattered to the peripheral part of the wafer and accumulated there.

As described above, it can be considered that, even if the wafer is continued to rotate at the number of revolutions described above, the entire surface of the substrate cannot be substantially coated with the coating liquid.

Next, a result of analysis of the coating unevenness and the in-plane uniformity in a case where a wafer having a pattern formed thereon is coated with the coating liquid will be described.

Using a stepped (patterned) wafer having 280 chips (including 72 defective chips in the peripheral part) mounted thereon, optimal values of the number of revolutions, the amount of chemical dispensed, the rate of discharge, the acceleration of discharge and the deceleration of discharge are determined according to a quality engineering method (Taguchi methods).

In the experiment, the L18 orthogonal table is used. FIG. 17 shows an allocation of the L18 orthogonal table. In this experiment, the deceleration of discharge in step S2 is 40 ml/second$^2$, and the total amount of coating liquid dispensed is 1 ml. The wafer used as a base is a circular silicon substrate having a diameter of 300 mm.

Figure 18:
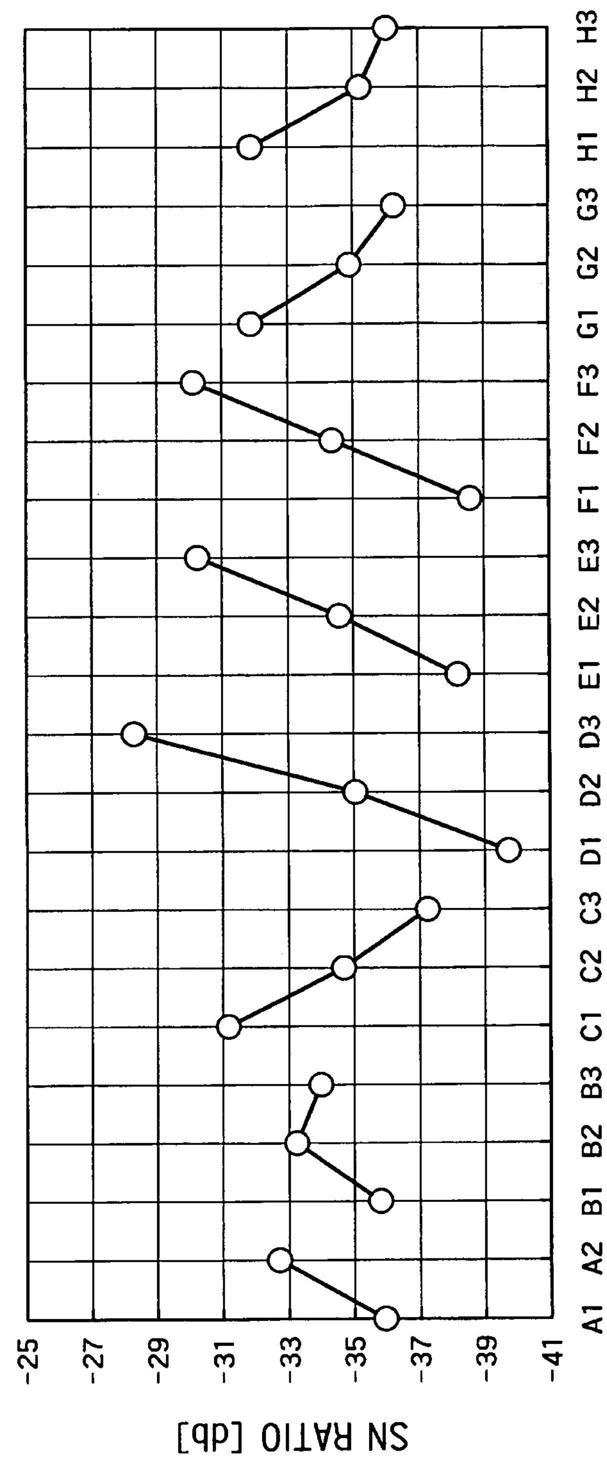
FIG. 18 is a factorial effect diagram showing the SN ratio obtained by analysis of the number of chips that suffer uneven coating in terms of smaller-the-better characteristic.

FIG. 18 is a factorial effect diagram showing the SN ratio obtained by analysis of the number of chips that suffer uneven coating in terms of smaller-the-better characteristic. In FIG. 18, the abscissa indicates the factor symbols and levels thereof shown in FIG. 17. In FIG. 18, higher SN ratios indicate lower coating unevenness.

As shown in FIG. 18, as the number of revolutions "$N_1$" becomes higher, the number of revolutions "$N_2$" becomes higher, or the amount of coating liquid dispensed in step S1 becomes larger, or when the coating liquid dispensing steps S1 and S2 are successively carried out, the coating unevenness is reduced (that is, the coating film formed on the substrate comes closer to the outer edge of the substrate).

As for the number of revolutions, this result is inconsistent with the result obtained under the conditions described earlier that the coating unevenness is reduced as the first number of revolutions "$N_1$" becomes higher, and the second number of revolutions "$N_2$" becomes lower. This inconsistency is probably because, although a flat substrate (without a pattern) is used under the conditions described earlier, a patterned substrate is used under the conditions for this experiment, and therefore, a different tendency occurs.

It can be considered that, regardless of whether the substrate has a pattern formed thereon or not, the coating film can be formed on a wider area of the substrate by setting the first number of revolutions "$N_1$" higher than the second number of revolutions "$N_2$".

In addition, as shown in FIG. 18, both for steps Si and S2, as the discharge rate becomes lower, the coating unevenness is reduced. As for the discharge rate, again, the result is inconsistent with the result of the experiment carried out with the substrate without a pattern. This is probably because a patterned substrate is used in this experiment.

Therefore, it is preferred that the number of revolutions and the discharge rate are approximately optimized depending on the condition of the surface of the substrate used.

Figure 19:
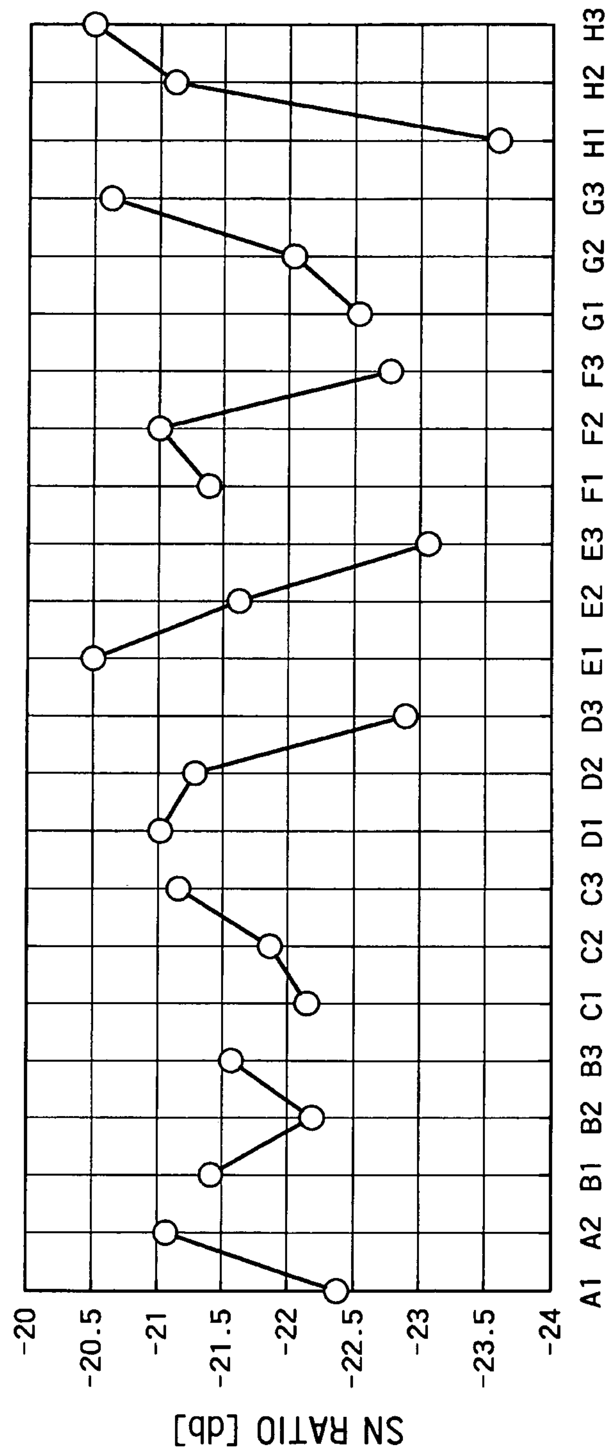
FIG. 19 is a factorial effect diagram showing the SN ratio obtained by analysis of the film thickness uniformity at a recess of a stepped part in terms of smaller-the-better characteristic.

FIG. 19 is a factorial effect diagram showing the SN ratio obtained by analysis of the film thickness uniformity at a recess of a stepped part in terms of smaller-the-better characteristic. In FIG. 19, the abscissa indicates the factor symbols and levels thereof shown in FIG. 17. In FIG. 19, higher SN ratios indicate higher film thickness uniformity.

As shown in FIG. 19, as the number of revolutions "$N_1$" becomes higher, or the number of revolutions "$N_2$" becomes higher, the film thickness uniformity is improved. As the amount of coating liquid dispensed in step S1 becomes smaller, the film thickness uniformity is improved. Furthermore, when the coating liquid dispensing steps S1 and S2 are carried out at an interval, the film thickness uniformity is improved. As the discharge rate in step Si or S2 becomes higher, the film thickness uniformity is improved. Both for steps S1 and S2, as the discharge rate becomes higher, the film thickness uniformity is improved.

In the case of the substrate without a pattern described above, the discharge rate in step S1 has no effect on the film thickness uniformity. In the case of the substrate without a pattern, as the discharge rate in step S2 becomes higher, the film thickness uniformity is improved. That is, this result is inconsistent with the quality engineering result shown in FIG. 19. This is probably because a substrate having a pattern formed thereon is used in the experiment shown in FIG. 19.

Therefore, it is preferred that the discharge rate is approximately optimized depending on the condition of the surface of the substrate used.

Comparison between FIGS. 18 and 19 shows that the requirements for reducing the coating unevenness and the requirements for improving the film thickness uniformity are incompatible. More specifically, from the viewpoint of reducing the coating unevenness, it is preferred that the first and second numbers of revolutions "$N_1$" and "$N_2$" are increased, the first amount "$M_1$" is increased (the second amount "$M_2$" is reduced), and the first and second discharge rates "V1" and "V2" are reduced. To the contrary, from the viewpoint of improving the film thickness uniformity, it is preferred that the first and second numbers of revolutions "$N_1$" and "$N_2$" are reduced, the first amount "$M_1$" is reduced (the second amount "$M_2$" is increased), and the first and second discharge rates "V1" and "V2" are increased. Therefore, in practice, each parameter has to be approximately optimized so that the coating unevenness is prevented while keeping the film thickness uniformity within an allowable range.

Next, there will be shown an example in which parameters optimized as described above are applied to a patterned substrate. A circular silicon substrate having a diameter of 300 mm is used as a base wafer. A pattern having a height difference of 500 nm and a space dimension of 50 nm or more is formed on this substrate, and a coating liquid is applied thereto. In this process, the first number of evolutions "$N_1$", the amount of coating liquid dispensed and the duration of coating in step S1 are 3500 rpm, 0.4 ml and 0.4 seconds, respectively, the second number of evolutions "$N_2$", the amount of coating liquid dispensed and the duration of coating in step S2 are 1500 rpm, 0.4 ml and 0.4 seconds, respectively (the amounts of coating liquid dispensed "$M_1$" and "$M_2$" are equal to each other, and the total amount of coating liquid dispensed is 0.8 ml), and the number of revolutions "$N_4$" for determining the film thickness is 1563 rpm. The first number of revolutions "$N_1$", which has a significant effect on the coating unevenness, is set as high as possible, and the second number of revolutions "$N_2$" is set lower from the viewpoint of the film thickness uniformity. On the other hand, the first and second amounts of coating liquid dispensed are set equal to each other from the viewpoint of the film thickness uniformity.

In addition, for the sake of comparison, a sample produced by coating a substrate having the same pattern height difference with a coating liquid by a conventional spin coating method (under the conditions that the number of revolutions in dispensing is 1200 rpm, and the amount of coating liquid dispensed is 2.0 ml) is also prepared.

According to the conditions described above, the total amount of coating liquid dispensed by the spin coating method according to this embodiment is 0.8 ml, although the total amount of coating liquid dispensed by the conventional spin coating method is 2.0 ml. Thus, even though the spin coating method according to this embodiment requires a reduced amount of coating liquid, the spin coating method according to this embodiment can evenly form a coating film having a uniform thickness over the entire surface of the substrate as with the conventional coating method.

COMPARISON EXAMPLE 1

As a comparison example 1, according to the conventional spin coating method, an experiment is carried out by changing the amount of coating liquid dispensed (the duration of discharge).

Figure 20:
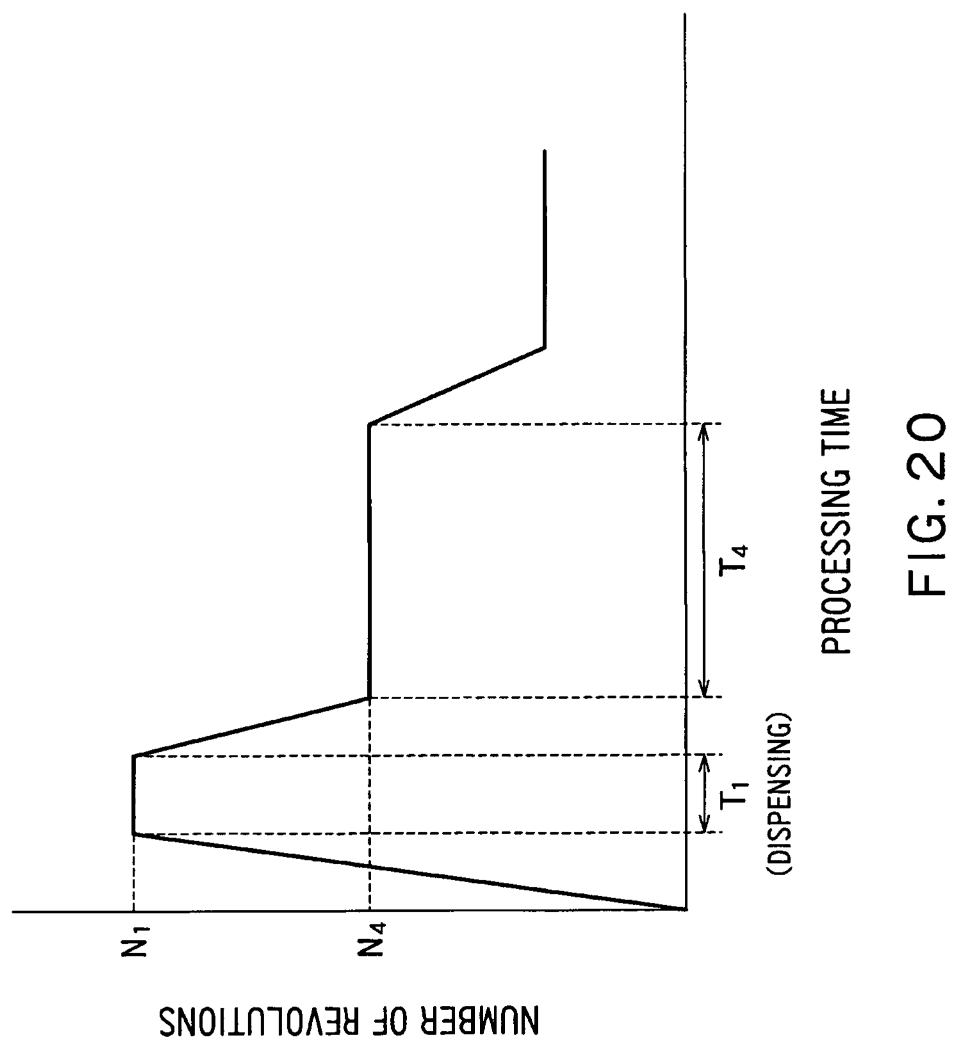
FIG. 20 is a diagram showing a coating sequence of the spin coating method according to the comparison example 1.

FIG. 20 is a diagram showing a coating sequence of the spin coating method according to the comparison example 1. In the comparison example 1, the first number of revolutions "$N_1$" is set at 1200 rpm, and the number of revolutions "$N_4$" for determining the film thickness is set at 694 rpm. The wafer used is a circular silicon substrate without a pattern having a diameter of 300 mm.

Figure 22:
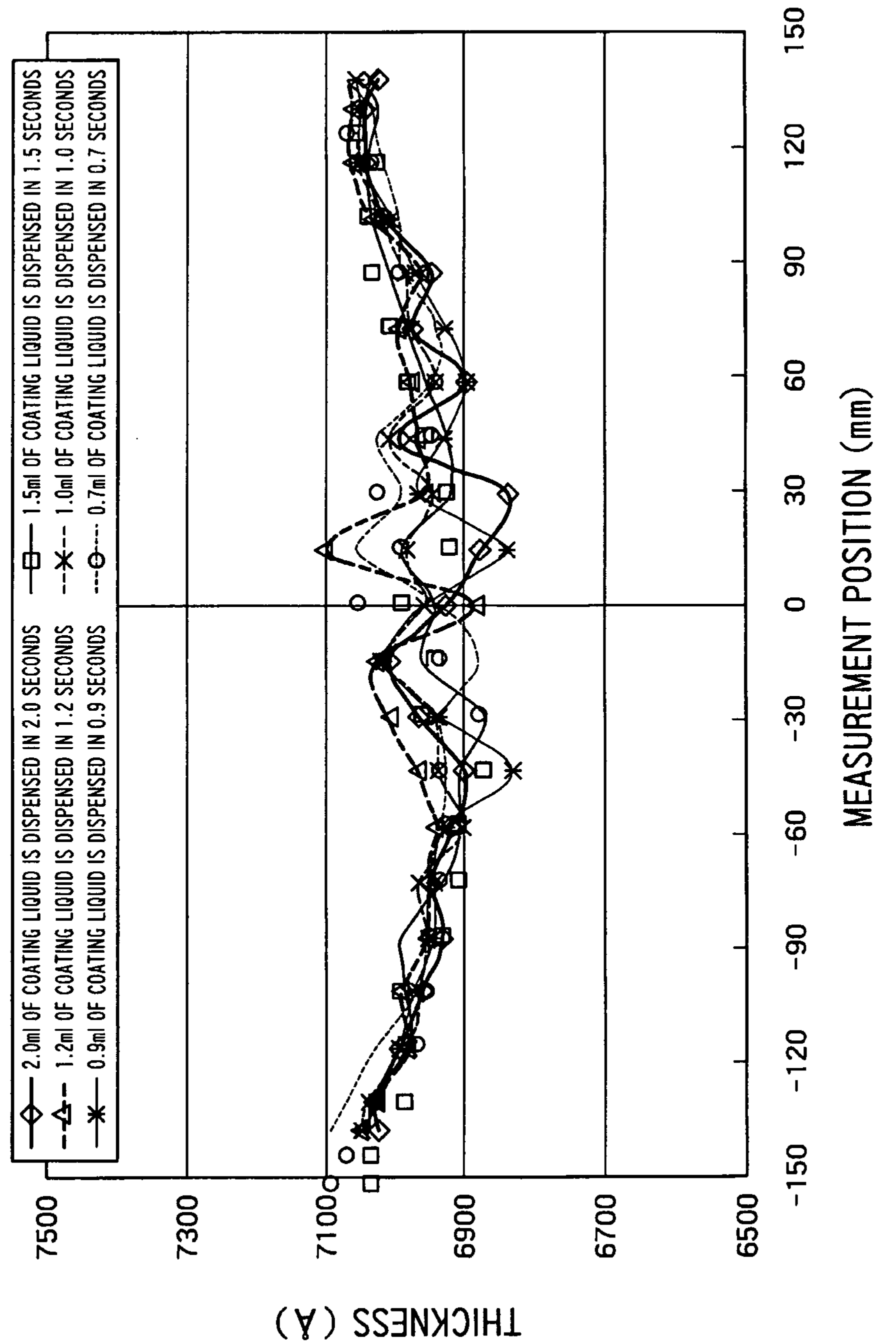
FIG. 22 is a graph showing relationships between the thickness of coating films formed by changing the amount of coating liquid dispensed according to the coating sequence of the comparison example 1 and the measurement position thereof in the wafer surface.

FIG. 21 is a table showing the in-plane uniformity 3σ/<x> of the thickness and the result of visual check of coating films formed by changing the amount of coating liquid dispensed according to the coating sequence of the comparison example 1. FIG. 22 is a graph showing relationships between the thickness of coating films formed by changing the amount of coating liquid dispensed according to the coating sequence of the comparison example 1 and the measurement position thereof in the wafer surface.

As shown in FIG. 21, even if the amount of coating liquid dispensed (the duration of discharge) is changed, the film thickness and the film thickness uniformity do not significantly vary. However, when the amount of coating liquid dispensed is equal to or smaller than 1.0 ml (the duration of discharge is equal to or less than 1.0 second), the coating film cannot be formed in the edge part of the wafer. As described above, according to this embodiment, the coating film can be formed in the edge part of the wafer if the total amount of coating liquid dispensed is 0.7 ml, for example.

Thus, according to the conventional spin coating method, the coating film cannot be formed over the entire surface of the wafer even if the amount of coating liquid dispensed is larger than the amount of coating liquid dispensed in this embodiment.

COMPARISON EXAMPLE 2

As a comparison example 2, an experiment is carried out according to the same coating sequence as in the comparison example 1 shown in FIG. 20 by setting the amount "$M_1$" of coating liquid dispensed at 0.7 ml and changing the first number of revolutions "$N_1$". The wafer used is a circular silicon substrate without a pattern having a diameter of 300 mm.

Figure 24:
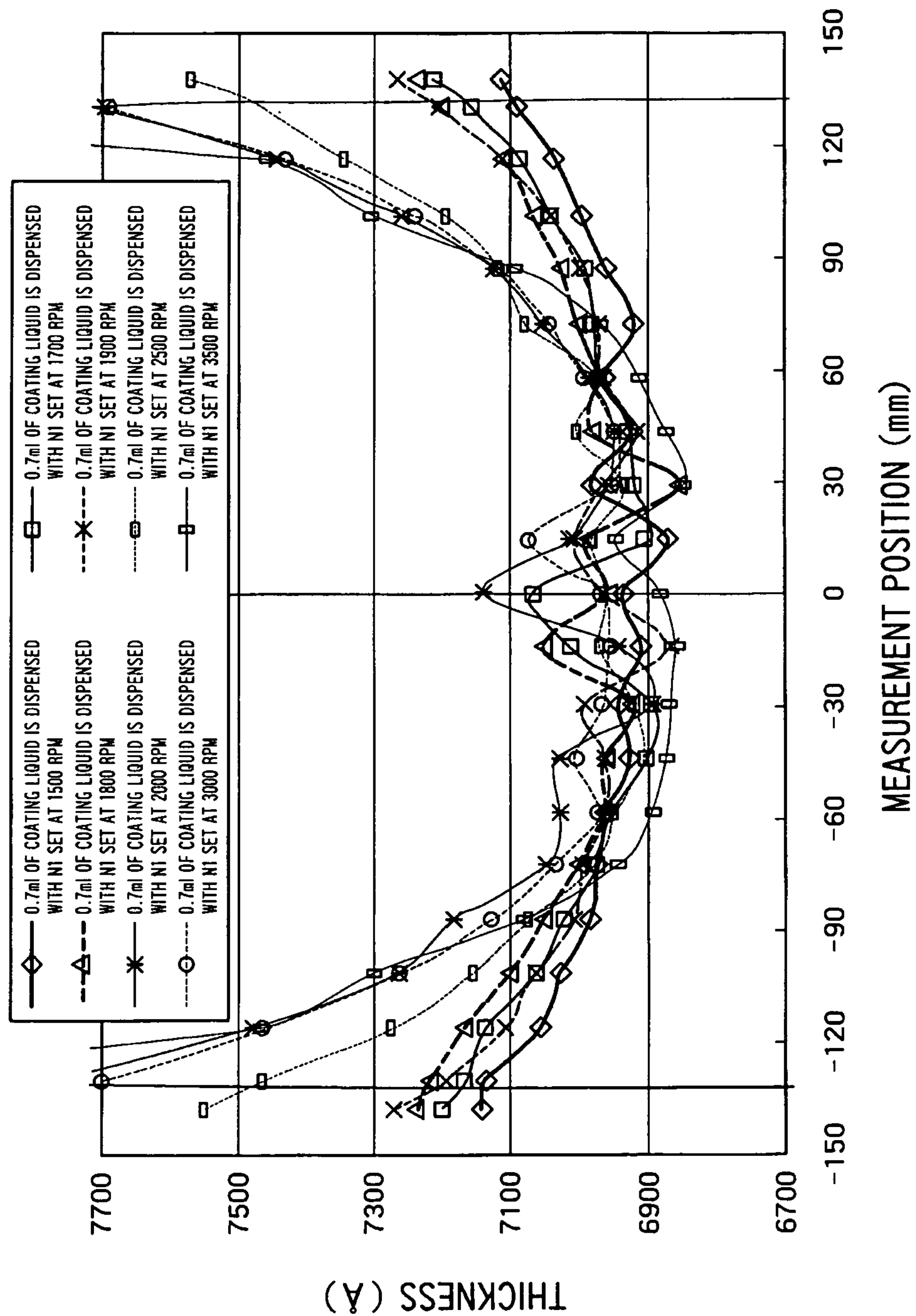
FIG. 24 is a graph showing relationships between the thickness of coating films formed by changing the first number of revolutions "$N_1$" according to the coating sequence shown in FIG. 20 and the measurement position thereof in the wafer surface.

FIG. 23 is a table showing the in-plane uniformity 3σ/<x> of the thickness and the result of visual check of coating films formed by changing the first number of revolutions "$N_1$" according to the coating sequence shown in FIG. 20. FIG. 24 is a graph showing relationships between the thickness of coating films formed by changing the first number of revolutions "$N_1$" according to the coating sequence shown in FIG. 20 and the measurement position thereof in the wafer surface.

As shown in FIG. 23, at all the number of revolutions, the edge part cannot be coated. Furthermore, as the first number of revolutions "$N_1$" increases, the film thickness uniformity is degraded.

In addition, as shown in FIG. 24, the film thickness at the central part of the wafer does not significantly vary regardless of the first number of revolutions "$N_1$". However, as the first number of revolutions "$N_1$" increases, the film thickness of the coating film at the edge part thereof increase, and the thickness of the coating film varies in a bowl-shaped curve.

As described above, according to the conventional spin coating method, if the total amount of coating liquid dispensed is set at 0.7 ml as in this embodiment, the coating film cannot be formed over the entire surface of the wafer even if the number of revolutions of the substrate is changed.

As described above, according to the spin coating method and the spin coating apparatus according to this embodiment, a coating film can be formed on a wider area while reducing the amount of coating liquid dispensed.

As described above, the coating material used in the experiment in this embodiment is a material having a viscosity of 1 mPa*s.

However, the same effects or advantages can be achieved even if a coating material having a viscosity equal to or higher than 0.1 mPa*s and equal to or lower than 1000 mPa*s at 25 degrees Celsius is used. The viscosity may be out of the range described above.

What is claimed is:

1. A spin coating method that supplies a coating liquid to a substrate and rotating the substrate to form a coating film, comprising:

dispensing a first amount of coating liquid to a central part of the substrate while rotating the substrate about the central part of the substrate at a first number of revolutions and maintaining the rotation at the first number of revolutions during said dispensing;

dispensing a second amount of coating liquid to the central part of the substrate while rotating the substrate at a second number of revolutions that is lower than the first number of revolutions after dispensing the first amount of coating liquid and maintaining the rotation at the second number of revolutions during said dispensing;

rotating the substrate at a third number of revolutions for a reflow processing carried out after dispensing the second amount of coating liquid; and rotating the substrate at a fourth number of revolutions for determining the film thickness of the coating liquid after rotating the substrate at the third number of revolutions, wherein the first number of revolutions is a number of revolutions at which the first amount of coating liquid does not uniformly spread over the substrate and an edge of the first amount of the coating liquid is swollen because of air resistance, wherein the first number of revolutions is a number of revolutions such that the coating liquid cannot practically spread over the entire surface of the substrate even if an amount of coating liquid is enough to coat the entire surface of the substrate at a number of revolutions lower than the first number of revolutions, wherein the edge of the first amount of coating liquid that is swollen is pushed toward a peripheral part of the substrate during the dispensing of the second amount of coating liquid, thereby reducing the height of the edge that is swollen and moving the first amount of the coating liquid on the edge that is swollen to coat the peripheral part of the substrate, wherein the third number of revolutions is lower than the second number of revolutions, and wherein the fourth number of revolutions is higher than the third number of revolutions.

2. The method according to claim 1, wherein the first amount is equal to or larger than the second amount.

3. The method according to claim 1, wherein the substrate is a patterned substrate and the coating liquid is applied thereon.

4. The method according to claim 2, wherein the substrate is a patterned substrate and the coating liquid is applied thereon.

5. The method according to claim 1, wherein the coating liquid is any of a photoresist, an antireflection material, a photoresist protective material, a resist pattern shrinkable material, a protective material for immersion exposure, polyimide, SOG, a low-k material and a sol-gel material.

6. The method according to claim 2, wherein the coating liquid is any of a photoresist, an antireflection material, a photoresist protective material, a resist pattern shrinkable material, a protective material for immersion exposure, polyimide, SOG, a low-k material and a sol-gel material,

7. The method according to claim 3, wherein the coating liquid is any of a photoresist, an antireflection material, a photoresist protective material, a resist pattern shrinkable material, a protective material for immersion exposure, polyimide, SOG, a low-k material and a sol-gel material.

8. The method according to claim 1, wherein the coating liquid is a planarizing material or a filler material.

9. The method according to claim 2, wherein the coating liquid is a planarizing material or a filler material.

10. The method according to claim 3, wherein the coating liquid is a planarizing material or a filler material.

* * * * *